(12) United States Patent
Kim

(10) Patent No.: US 10,483,203 B2
(45) Date of Patent: Nov. 19, 2019

(54) SEMICONDUCTOR MEMORY DEVICE HAVING PADS OF VARYING WIDTHS

(71) Applicant: SK hynix Inc., Icheon-si Gyeonggi-do (KR)

(72) Inventor: Yung Jun Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/639,316

(22) Filed: Jun. 30, 2017

(65) Prior Publication Data

US 2018/0130737 A1 May 10, 2018

(30) Foreign Application Priority Data

Nov. 9, 2016 (KR) ........................ 10-2016-0148829

(51) Int. Cl.
| | |
|---|---|
| *H01L 29/792* | (2006.01) |
| *H01L 23/528* | (2006.01) |
| *H01L 21/28* | (2006.01) |
| *H01L 21/768* | (2006.01) |
| *H01L 27/1157* | (2017.01) |
| *H01L 27/11582* | (2017.01) |
| *H01L 23/522* | (2006.01) |
| *H01L 27/11575* | (2017.01) |

(52) U.S. Cl.
CPC ...... *H01L 23/528* (2013.01); *H01L 21/28282* (2013.01); *H01L 21/76816* (2013.01); *H01L 21/76877* (2013.01); *H01L 27/1157* (2013.01); *H01L 27/11582* (2013.01); *H01L 23/5226* (2013.01); *H01L 27/11575* (2013.01)

(58) Field of Classification Search
CPC ............. H01L 23/528; H01L 27/11582; H01L 27/1157; H01L 21/76877; H01L 21/76816; H01L 21/28282; H01L 23/5226; H01L 27/11575

See application file for complete search history.

(56) References Cited

U.S. PATENT DOCUMENTS

| | | | | |
|---|---|---|---|---|
| 2012/0061744 | A1* | 3/2012 | Hwang | ............. H01L 27/11565 257/324 |
| 2013/0107602 | A1* | 5/2013 | Oh | .................... H01L 27/11556 365/51 |
| 2015/0270283 | A1* | 9/2015 | Oh | .................... H01L 27/11582 365/185.29 |
| 2016/0358933 | A1* | 12/2016 | Rabkin | ............. H01L 27/11582 |
| 2017/0040338 | A1* | 2/2017 | Lee | .................... H01L 27/11582 |
| 2018/0097006 | A1* | 4/2018 | Kim | .................... H01L 27/1157 |

FOREIGN PATENT DOCUMENTS

| | | |
|---|---|---|
| KR | 1020150100325 A | 9/2015 |
| KR | 1020150134934 A | 12/2015 |
| KR | 1020160028742 A | 3/2016 |

* cited by examiner

*Primary Examiner* — Ismail A Muse
(74) *Attorney, Agent, or Firm* — William Park & Associates Ltd.

(57) ABSTRACT

Provided herein is a semiconductor memory device. The semiconductor memory device may include channel layers protruding away from a substrate. The semiconductor memory device may include a plurality of pads respectively coupled to the channel layers. The widths of the pads may or may not be increased depending on a bending of the channel layers.

26 Claims, 21 Drawing Sheets

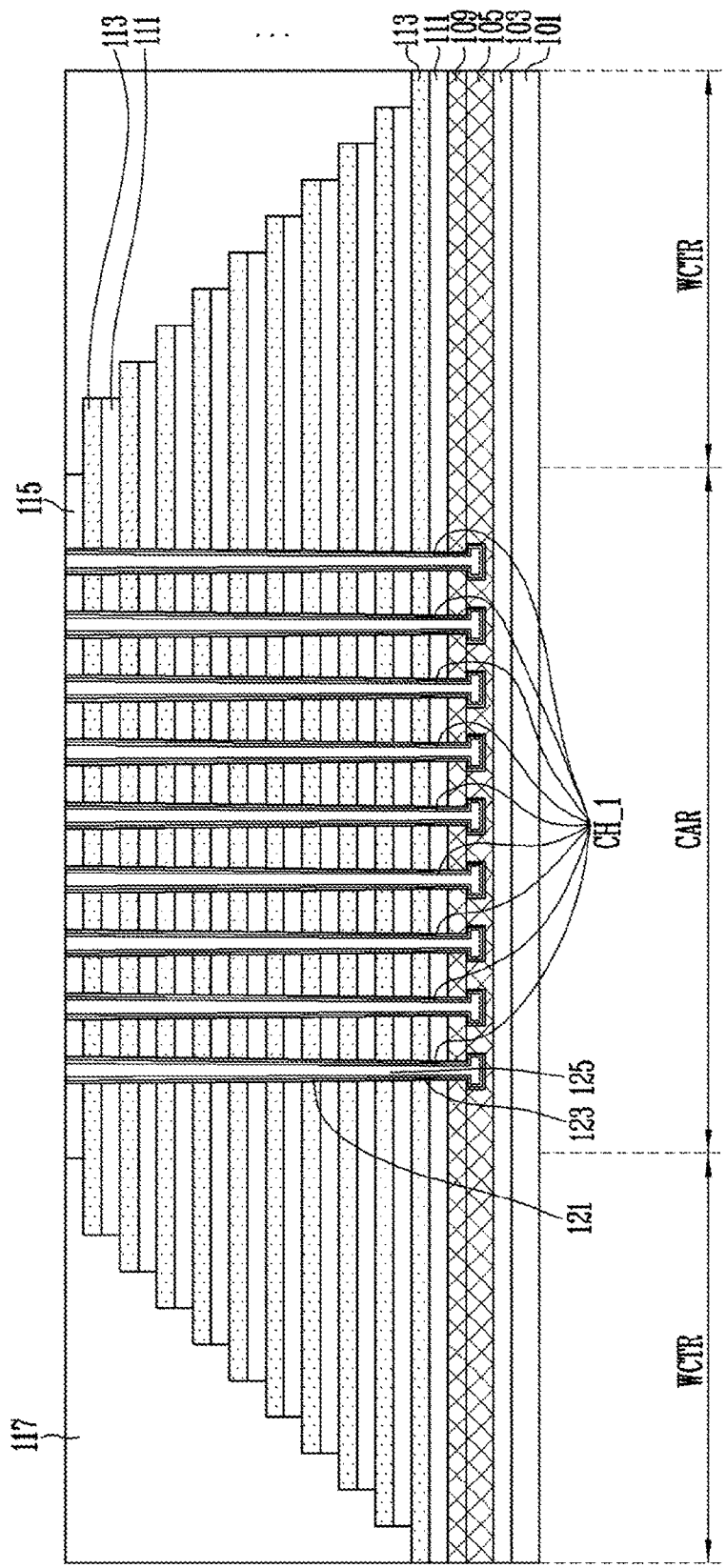

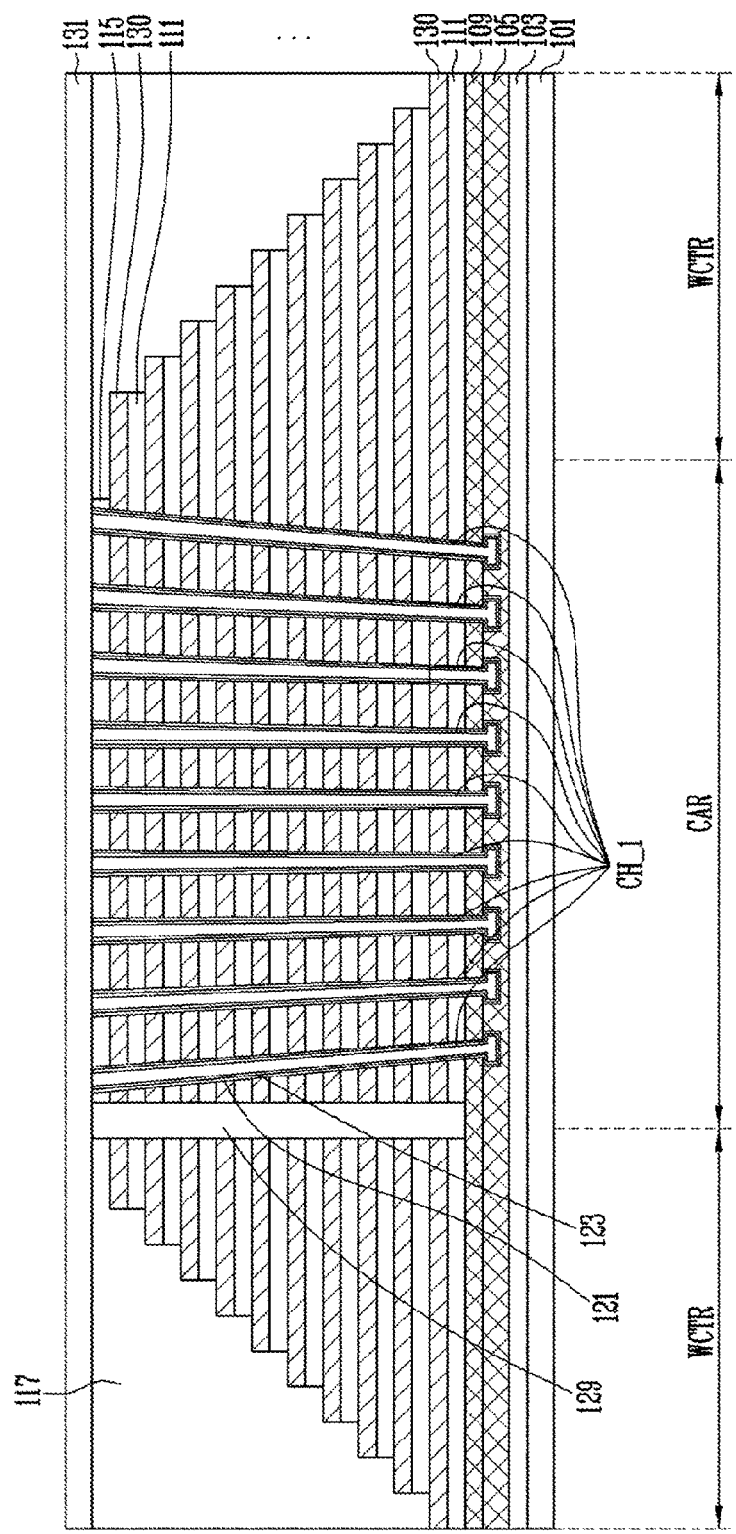

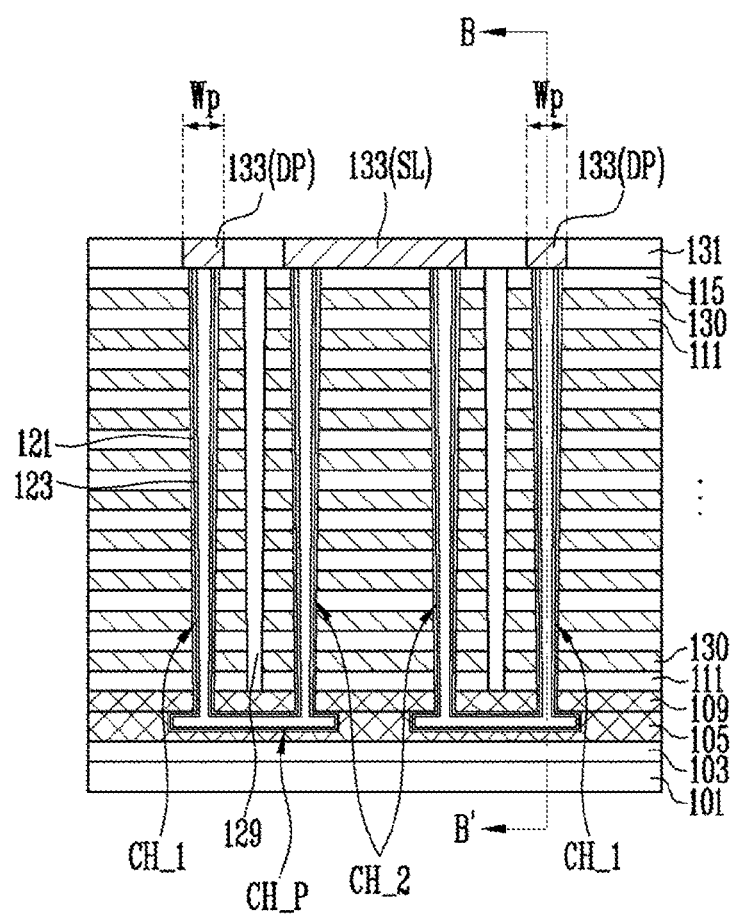

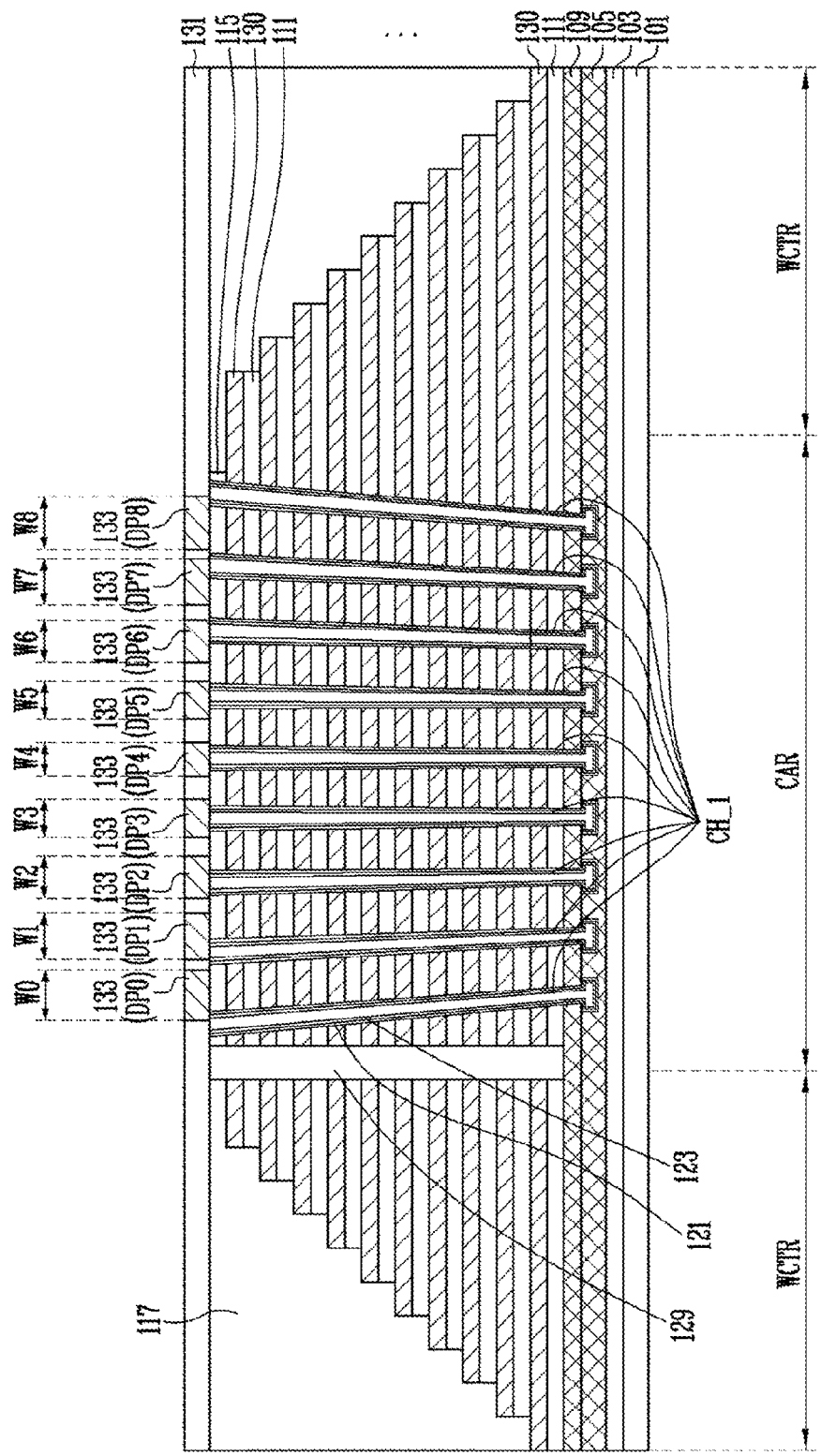

SEMICONDUCTOR MEMORY DEVICE HAVING PADS OF VARYING WIDTHS

CROSS-REFERENCE TO RELATED APPLICATION

The present application claims priority under 35 U.S.C § 119(a) to Korean patent application 10-2016-0148829 filed on Nov. 9, 2016 in the Korean Intellectual Property Office, the entire disclosure of which is incorporated by reference herein.

BACKGROUND

1. Technical Field

Various embodiments of the present disclosure may generally relate to a semiconductor memory device, and more particularly, to a semiconductor memory device relating to pads.

2. Related Art

Semiconductor memory devices consist of a plurality of memory cells which are configured to store data.

For the high integration of the semiconductor memory devices, a three-dimensional semiconductor memory device consisting of memory cells that are arranged in three dimensions has been proposed.

A three-dimensional semiconductor memory device consists of interlayer insulating layers and word lines that are stacked alternately with each other, and channel layers that are formed in channel holes passing therethrough, with memory cells stacked along the channel layers. The channel layer is coupled to a bit line and a source layer.

Due to characteristics of a three-dimensional semiconductor memory device consisting of a vertical stack structure, the channel layer may be misaligned with the bit line during the process of manufacturing the three-dimensional semiconductor memory device.

Thereby, leakage current from the bit line may be caused, and malfunction of the semiconductor memory device may be caused.

SUMMARY

According to an embodiment, a semiconductor memory device may be provided. The semiconductor memory device may include channel layers protruding away from a substrate. The semiconductor memory device may include a plurality of pads respectively coupled to the channel layers. The widths of the pads may or may not be increased depending on a bending of the channel layers.

BRIEF DESCRIPTION OF THE DRAWINGS

FIGS. 6A to 12B are diagrams illustrating a method of manufacturing a semiconductor memory device according to an embodiment of the present disclosure.

DETAILED DESCRIPTION

Figure 1:
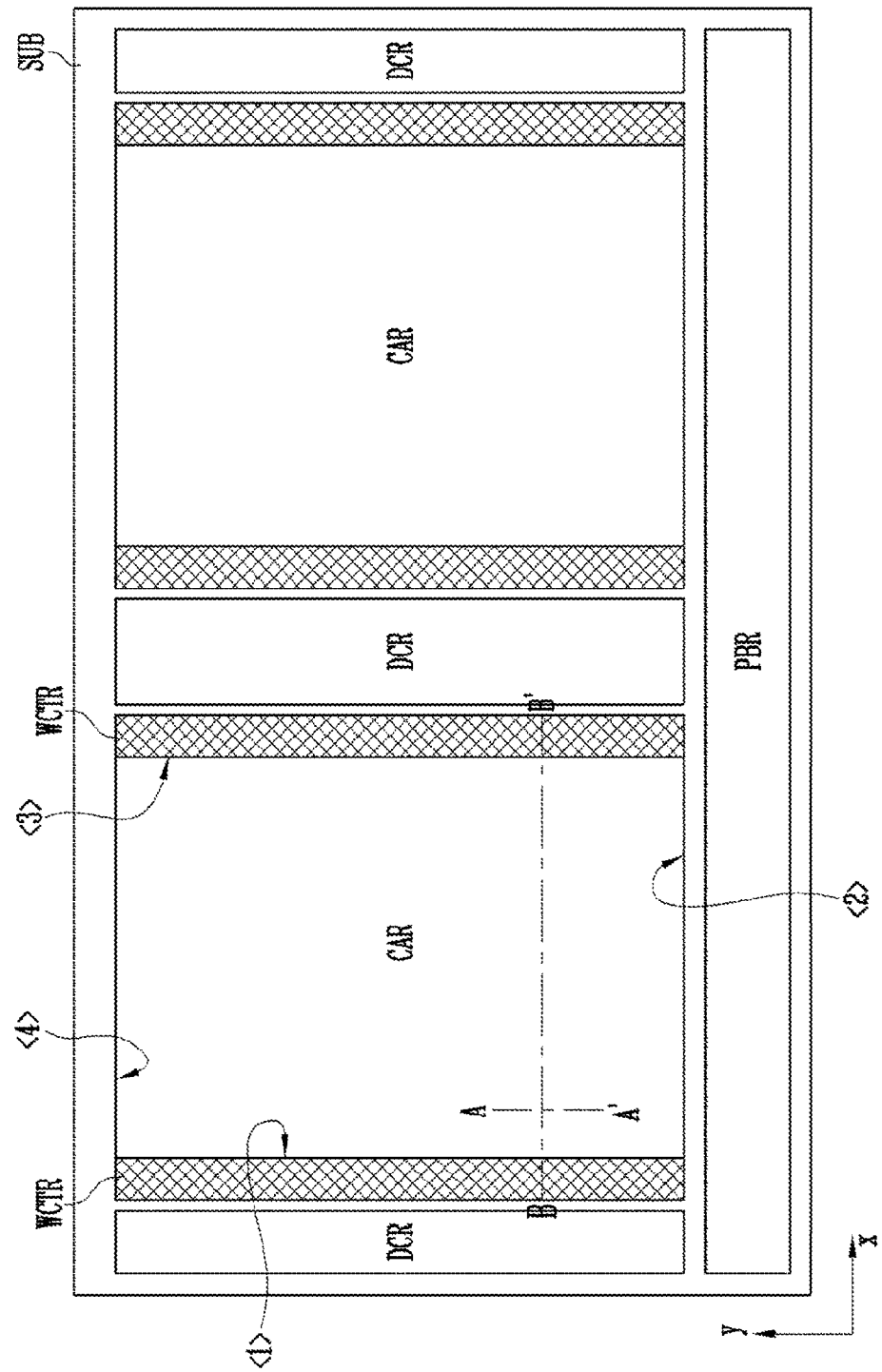
FIG. 1 is a block diagram illustrating a semiconductor memory device according to an embodiment of the present disclosure.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Various embodiments of the present disclosure may be directed to a semiconductor memory device which may improve an operational reliability.

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1 is a block diagram illustrating a semiconductor memory device according to an embodiment of the present disclosure.

Referring to FIG. 1, the semiconductor memory device may include a cell array region CAR, a word line contact region WCTR, a decoding circuit region DCR, and a page buffer region PBR.

The cell array region CAR is a region in which a cell array is disposed. Memory cells for storing data are formed in the cell array region CAR. For example, strings each including at least one source select transistor, a plurality of source side memory cells, at least one pipe transistor, a plurality of drain side memory cells and at least one drain select transistor that are coupled in series with each other may be arranged in the cell array region CAR. Each of strings may have a U shape. In other examples, strings each including at least one source select transistor, a plurality of memory cells and at least one drain select transistor that are coupled in series with each other may be arranged in the cell array region CAR. Each of the strings may be formed in a straight shape along a channel layer protruding from a surface of a substrate SUB.

Word lines, select lines and bit lines are disposed in the cell array region CAR. The word lines and bit lines are electrically coupled to the memory cells.

The word line contact region WCTR is a region that extends from the word lines stacked on the cell array region CAR to respectively drive the stacked memory cells, and is coupled to word line contact plugs. Although not illustrated, the semiconductor memory device may further include a select line contact region that extends from the select lines formed in the cell array region CAR.

For example, in the case where four sides <1> to <4> are defined in a counterclockwise direction based on the cell array region CAR, the word line contact region WCTR may be defined such that the word line contact region WCTR comes into contact with at least one of the first side <1> and the third side <3> that face each other. For instance, in the case where each string has a 'U' shape, as illustrated in FIG. 1, the word line contact region WCTR is defined on each of the first side <1> and the third side <3>. In other examples, in the case where each string has a straight shape, the word line contact region WCRT may be defined on any one of the first side <1> and the third side <3>.

The word line contact region WCTR may be disposed between the cell array region CAR and the decoding circuit region DCR. A wiring structure that electrically couples the word lines to driving transistors disposed in the decoding circuit region DCR may be disposed in the word line contact region WCTR. The wiring structure may include the word line contact plugs.

The word lines may extend from the cell array region CAR to the word line contact region WCTR. To facilitate the electrical coupling of the stacked word lines with the word line contact plugs, the word lines may be formed to have a stepwise structure in the word line contact region WCTR.

The decoding circuit region DCR is a region in which there are formed the driving transistors that are coupled to the memory strings formed on the cell array region CAR through the select lines and the word lines to transmit operating voltages to the memory strings. For example, the decoding circuit region DCR may include a row decoder. The row decoder may include pass transistors for controlling whether an operating voltage is applied to the select lines and word lines.

The page buffer region PBR is coupled to the bit lines of the cell array region CAR to exchange data with the cell array region CAR, and temporarily stores the received data. The page buffer region may include, for example but not limited to, a precharge circuit, a bit line select transistor, a sensing circuit and an input/output circuit.

Although not illustrated in the drawings, the semiconductor memory device may include a word line driver, a sense amp, a control circuit, etc. as a peripheral circuit which functions to drive the memory cells and read data stored in the memory cells.

Hereinafter, a vertical stack structure of the semiconductor memory device according to an embodiment of the present disclosure will be described with reference to FIG. 2. Although, for the sake of explanation, the following description will be focused on the configuration of the memory device including a pipe gate, the present disclosure is not limited to this.

Figure 2:
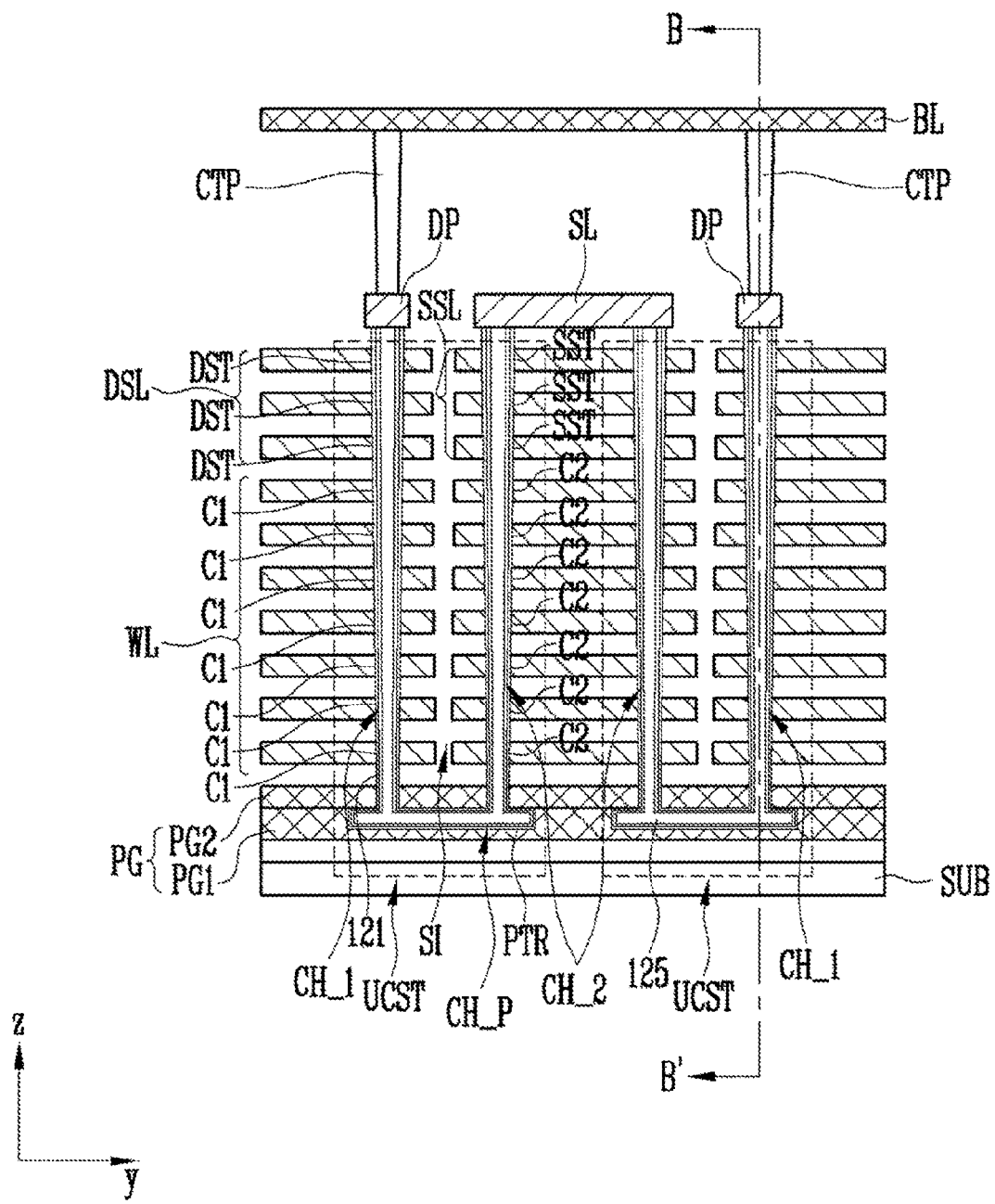
FIG. 2 is a sectional view taken along line A-A' of FIG. 1 to illustrate the semiconductor memory device according to an embodiment of the present disclosure.

FIG. 2 is a sectional view taken along line A-A' of FIG. 1 to illustrate the semiconductor memory device according to an embodiment of the present disclosure.

Referring to FIG. 2, the semiconductor memory device may include a plurality of strings UCST each having a 'U' shape.

Each of the strings UCST may include a first channel layer CH_1 and a second channel layer CH_2. The first channel layer CH_1 and the second channel layer CH_2 may be coupled to each other through a pipe channel layer CH_P formed in a lower portion of the string USCT.

A pad DP may be formed on an upper end of the first channel layer CH_1, and a contact plug CTP may be formed on an upper surface of the pad DP. The upper end of the first channel layer CH_1 may be coupled with a lower surface of the pad DP, and the upper surface of the pad DP may be coupled with a lower end of the contact plug CTP. The pad DP may have a width greater than that of the first channel layer CH_1 or the contact plug CTP. A bit line BL may be formed on the contact plug CTP, and an upper end of the contact plug CTP may be coupled with a lower surface of the bit line BL.

A common source line SL may be formed on an upper end of the second channel layer CH_2. The common source line SL may be coupled to the second channel layer without a contact plug.

Referring to FIG. 2, the bit lines BL may be conductive patterns that are isolated from a substrate SUB and disposed over the substrate SUB. The bit lines may be isolated from each other and disposed parallel with each other. For example, the bit lines may extend in a y-axis direction in an xyz coordinate system, and be disposed parallel with each other in an x-axis direction.

The common source line SL may be conductive patterns that are isolated from the bit line and the substrate and disposed between the bit line and the substrate. The common source line may extend in a direction intersecting the bit lines. For example, the common source lines may extend in the x-axis direction, and be disposed parallel with each other in the y-axis direction.

Each string UCST may include a pipe transistor PTR, a pair of memory cell groups C1 and C2 coupled to opposite ends of the pipe transistor PTR, a drain select transistor DST and a source select transistor SST that are respectively coupled to the corresponding memory cell groups C1 and C2. For example, in an embodiment, each string UCST may include a pipe gate PG, a pair of memory cell groups C1 and C2 coupled to opposite ends of the pipe gate PG, a drain select transistor DST and a source select transistor SST that are respectively coupled to the corresponding memory cell groups C1 and C2.

A pipe gate PG may include a first pipe gate PG1 and a second pipe gate PG2, and the pipe channel layer CH_P may be formed in the first pipe gate PG1.

The outer surface of pipe channel layer CH_P is enclosed by the pipe gate PG with a multilayer layer 121 interposed therebetween. The multilayer layer 121 may be formed of insulating layers and include a charge trapping layer.

The two memory cell groups C1 and C2 may include multi-layered memory cells stacked between the substrate SUB and the bit line BL or between the substrate SUB and the common source line SL. The multi-layered memory cells C1 and C2 may include multi-layered word lines WL and the channel layers CH_1 and CH_2.

The channel layers CH_1 and CH_2 may protrude from the upper substrate SUB toward the bit line BL, and the multi-layered memory cells C1 and C2 may be stacked along the corresponding channel layers CH_1 and CH_2.

The two channel layers CH_1 and CH_2 are coupled to the pipe channel layer CH_P of the string UCST. Hereinafter, for the sake of explanation, a channel layer coupled to the pad DP will refer to the first channel layer CH_1, and a channel layer coupled to the common source line SL will refer to the second channel layer CH_2.

The word lines WL of the memory cells C1 stacked along the first channel layer CH_1 and the word lines WL of the memory cells C2 stacked along the second channel layer CH_2 are divided by a slit SI formed between the first and second channel layers CH_1 and CH_2.

The word lines WL extend in a direction intersecting the bit line BL. For example, the multi-layered word lines WL extend in the x-axis direction, and the slit SI extends along the direction in which the word lines WL extend. In addition, the word lines WL enclose the first or second channel layer CH_1 or CH_2 with the multilayer layer 121 interposed therebetween. The number of word lines WL to be stacked may be changed depending on the number of memory cells to be stacked.

Each of the first and second channel layers CH_1 and CH_2 may have a hollow tubular shapes. In this case, each of the first and second channel layers CH_1 and CH_2 having a tubular shape may be filled with a gap fill insulating layer 125. The upper portion of the tubular-shaped structure that is defined by each of the first and second channel layers CH_1 and CH_2 may be filled with a doped polysilicon layer to reduce channel resistance. The multilayer layer 121 may have a structure in which a charge blocking layer, the charge trapping layer, and or a tunnel insulating layer are stacked.

Select transistors DST and SST may include drain select transistors DST coupled to the upper portion of the first channel layer CH_1, and source select transistors SST coupled to the upper portion of the second channel layer CH_2.

The drain select transistors DST may include the first channel layer CH_1 and drain select lines DSL. The drain select lines DSL may extend in a direction intersecting the bit line BL, for example, in the x-axis direction. The drain select lines DSL may be disposed to overlap with the first channel layer CH_1 enclosing the doped polysilicon layer.

The source select transistor SST may include the second channel layer CH_2 and source select lines SSL. The source select lines SSL may extend in a direction intersecting with the bit line BL, for example, in the x-axis direction. The source select lines SSL may be disposed to overlap with the second channel layer CH_2 enclosing the doped polysilicon layer.

The pad DP, the contact plug CTP and the bit line BL may be successively stacked on the first channel layer CH_1.

During the process of manufacturing the semiconductor device, a problem in which the contact plug CTP is misaligned with the first channel layer CH_1 may be caused. The pad DP may be formed, for example, to overcome the problem. For example, the pad DP may have a width greater than that of the upper end of the first channel layer CH_1 or the lower end of the contact plug CTP. Furthermore, since different first channel layers CH_1 must be electrically blocked from each other, the pad DP may be formed in an island shape on each of the first channel layers CH_1.

The common source line SL may be formed on the upper end of the second channel layer CH_2. The common source line SL may be formed on the same plane as that of the pad DP, and may have the form of a line extending in the x-axis direction because a source voltage may be applied in common to the second channel layers CH_2.

In the semiconductor memory device having the above-described structure, a phenomenon in which a cell plug is bent may be induced by various stresses that are caused by the process of manufacturing the semiconductor memory device. Thereby, the problem of misalignment between the channel layer and the contact plug is exacerbated. Hereinafter, the semiconductor memory device according to an embodiment of the present disclosure will be described with reference to FIG. 3.

Figure 3:
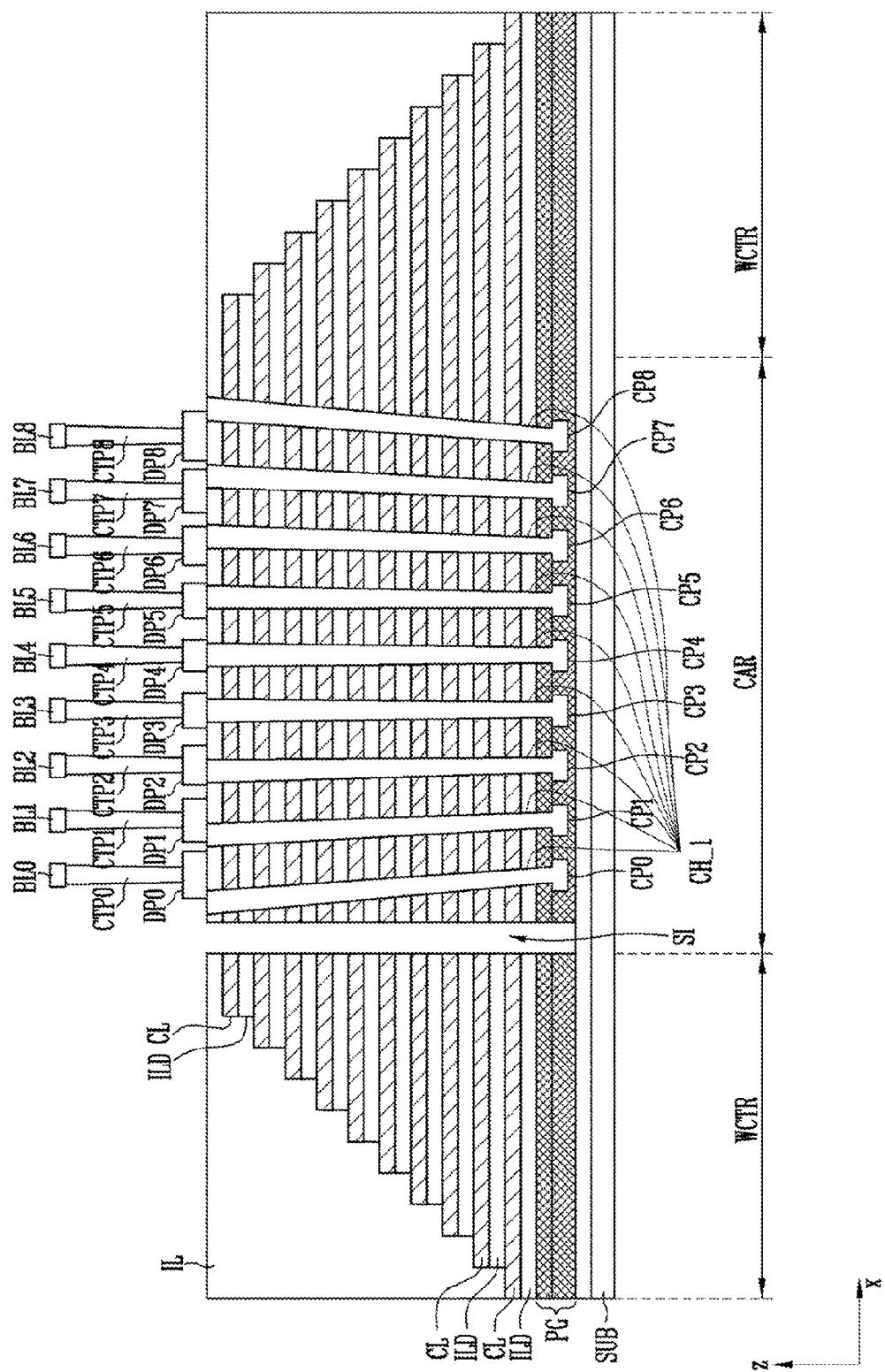
FIG. 3 is a sectional view taken along line B-B' of FIG. 1 to illustrate the semiconductor memory device according to an embodiment of the present disclosure.

FIG. 3 is a sectional view taken along line B-B' of FIG. 1 to illustrate the semiconductor memory device according to an embodiment of the present disclosure. Line B-B' illustrated in FIG. 1 is the same as line B-B' illustrated in FIG. 2.

Referring to FIG. 3, cell plugs CP0 to CP8 that penetrate the insulating layers ILD and the conductive layers CL from the substrate SUB and protrude upward therefrom are formed in the cell array region CAR. Each of the cell plugs CP0 to CP8 may include the corresponding channel layer CH_1, CH_2 and the multilayer layer 121 enclosing the channel layer CH_1, CH_2. In the case where each of the channel layers CH_1 and CH_2 has a tubular shape, the cell plug may also include the gap fill insulating layer 125 with which the channel layer is filled, and the doped polysilicon layer.

Referring to FIG. 3, for the sake of explanation, it is assumed that the total number of cell plugs CP which are arranged in the x-axis direction in one cell array region CAR is nine, and the cell plugs are successively designated as CP0 to CP8 in the x-axis direction. Corresponding to this, the total number of pads DP that are coupled to the respective cell plugs is also nine, and the pads DP are successively designated as DP0 to DP8 in the x-axis direction. The total number of contact plugs CTP that are coupled to the respective pads is also nine, and the contact plugs CTP are successively designated as CTP0 to CTP8 in the x-axis direction. The total number of bit lines BL that are coupled to the respective contact plugs is also nine, and the bit lines BL are successively designated as BL0 to BL8 in the x-axis direction. The present disclosure is not limited to this.

Furthermore, although it has been illustrated that only one contact plug, one pad and one cell plug are coupled to each bit line since FIG. 3 is a sectional view taken along line B-B' of FIG. 1, each bit line may be coupled with a plurality of cell plugs that are arranged in a row along the direction (that is, the y-axis direction) in which the bit line extends. In addition, each bit line may be coupled with a plurality of contact plugs that are arranged in a row along the direction (that is, the y-axis direction) in which the bit line extends.

The cell plugs CP0 to CP8 may be bent by various stresses that may be caused through the process of manufacturing the semiconductor memory device.

For example, the process of manufacturing the semiconductor memory device may include the step of forming a structure in which the interlayer insulating layers ILD and the sacrificial layers are stacked, the step of forming the cell plugs CP0 to CP8 passing through the stacked structure, the step of patterning the stacked structure in a stepwise shape, the step of forming a planarization insulating layer IL that covers the stepwise stacked structure, the step of forming the slit SI passing through the stacked structure, the step of forming a recess RC by removing the sacrificial layers through the slit SI, and the step of filling the recess RC with the conductive layers CL.

Tensile and or compressive (tensile/compressive) force may be applied between the planarization insulating layer IL that covers the stepwise stacked structure and the interlayer insulating layers ILD that form the stepwise stacked structure.

Thereby, the cell plugs CP0 to CP8 may be bent toward the word line contact region WCTR. The tensile/compressive force increases as the number of stacks of insulating layers ILD that form the stacked structure increases. The tensile/compressive force increases toward the word line contact region WCTR. That is, portions close to the word line contact region WCTR have tensile/compressive force greater than that of portion distant from the word line contact region WCTR. Therefore, as illustrated in FIG. 3, the bending phenomenon of the cell plugs CP0 to CP8 is mainly caused in opposite side edges of the cell array region CAR that are close to the respective word line contact regions WCTR.

That is, the bending phenomenon is significantly increased in the opposite side edges of the cell array region CAR that are close to the respective word line contact regions WCTR, and the bending phenomenon is reduced toward the center of the cell array region CAR.

Taking such a bending tendency of the cell plugs CP0 to CP8 into account, the pads DP0 to DP8 according to an embodiment of the present disclosure have a differential-width structure in which the width thereof is increased toward the word line contact region WCTR including the stepwise stacked structure.

Consequently, although the cell plugs are bent, misalignment between the contact plug and the first channel layer is effectively compensated for by the pads according to the embodiment of the present disclosure designed taking the bending phenomenon into account.

Furthermore, the misalignment may be caused by contact plug bending as well as the cell plug bending. In addition, the misalignment may be caused when the cell plug and the contact plug are simultaneously bent. The pads having a differential-width structure according to an embodiment of the present disclosure may have differentially divided margins, thus effectively coping with the misalignment that is caused by various factors.

Although the description with reference to FIG. 3 has been focused on the case of the semiconductor memory device including 'U'-shaped string, the same description and concepts may also be applied to the case where the string has a straight shape.

Figure 4:
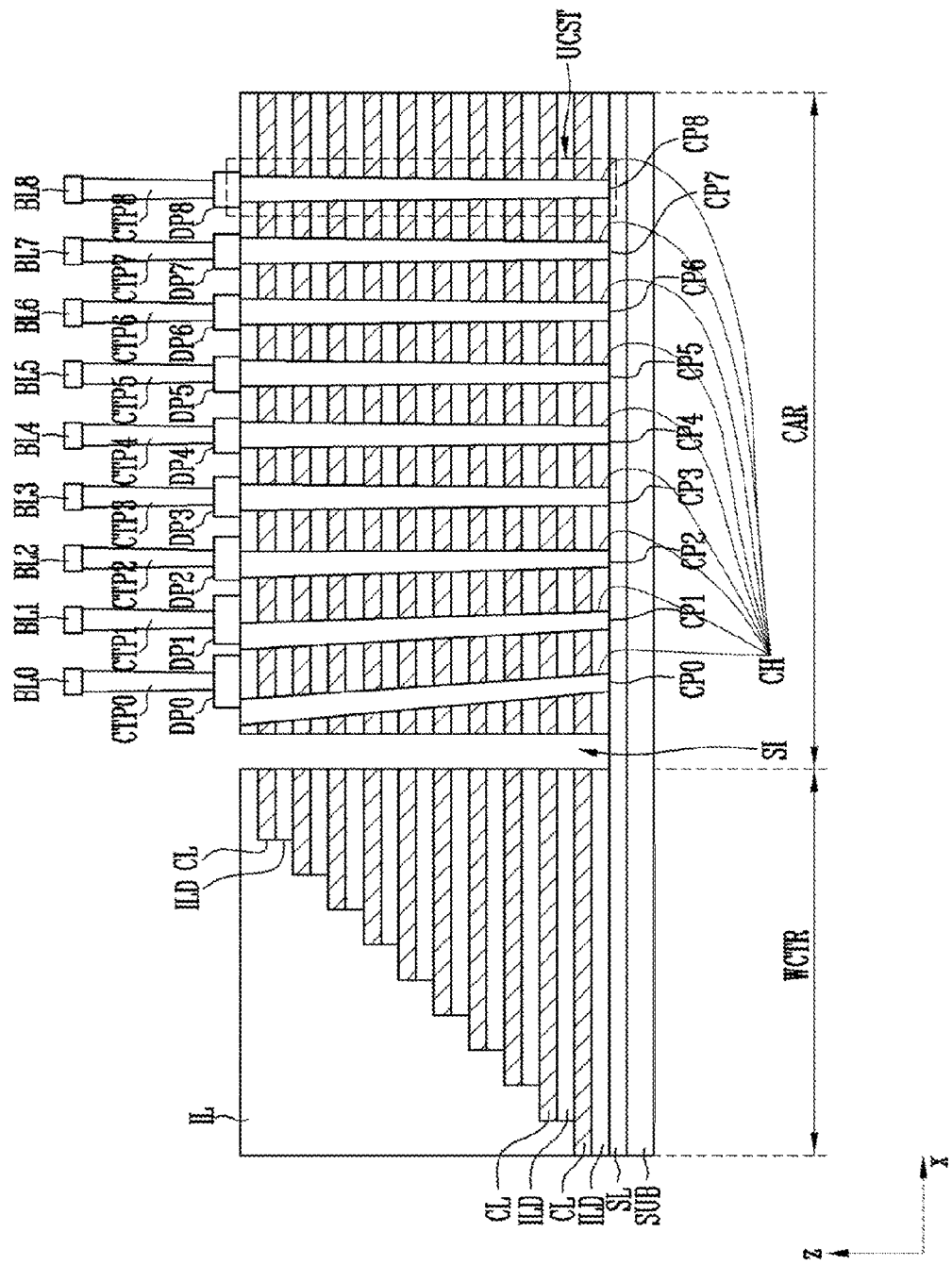
FIG. 4 is a sectional view taken along line B-B' of FIG. 1 to illustrate the semiconductor memory device according to an embodiment of the present disclosure.

FIG. 4 is a sectional view taken along line B-B' of FIG. 1 to illustrate the semiconductor memory device according to an embodiment of the present disclosure.

Referring to FIG. 4, as described above, in the case where strings SCST each having a straight shape are arranged, the word line contact region WCTR may be defined on any one of the first side <1> and the third side <3> of the cell array region CAR. In the present disclosure, for the sake of explanation, it is assumed that the word line contact region WCTR is defined on the first side <1> of the cell array region CAR.

Lower ends of the channel layers CH are coupled to the common source line SL. The common source line SL may make contact with the bottoms of the channel layers CH. The common source line SL may have various structures. The common source line SL may be a doped polysilicon layer formed on the substrate SUB. The common source line SL may be a region that is formed by implanting a dopant into the substrate SUB. Each channel layer CH may come into contact with an upper surface of the common source line SL and extend toward the corresponding bit line BL.

In the same manner as the 'U'-shaped string UCST, the process of manufacturing the semiconductor memory device that includes the straight strings SCST may include the step of forming a structure in which the interlayer insulating layers ILD and the sacrificial layers are stacked, the step of forming cell plugs CP0 to CP8 passing through the stacked structure, the step of patterning the stacked structure in a stepwise shape, the step of forming a planarization insulating layer IL that covers the stepwise stacked structure, the step of forming a slit SI passing through the stacked structure, the step of forming a recess RC by removing the sacrificial layers through the slit SI, and the step of filling the recess RC with conductive layers CL. Therefore, the above-described tensile/compressive force may be applied between the planarization insulating layer IL that covers the stepwise stacked structure and the interlayer insulating layers ILD that form the stepwise stacked structure.

The bending phenomenon of the cell plugs CP0 to CP8, as illustrated in FIG. 4, increases toward the word line contact region WCTR. In contrast, the bending phenomenon of the cell plugs is reduced as the distance from the word line contact region WCTR increases.

As such, the bending phenomenon of the cell plugs may be caused in one direction. That is, the bending phenomenon of the cell plugs may be caused in both directions as described with reference to FIG. 3, and be caused in one direction as described with reference to FIG. 4.

Since the pads DP0 to DP8 according to an embodiment of the present disclosure have the differential-width structure in which the width is increased toward the word line contact region WCTR including the stepwise stacked structure, the misalignment between the contact plugs CTP0 to CTP8 and the cell plugs CP0 to CP8 is effectively mitigated.

Figure 5A:
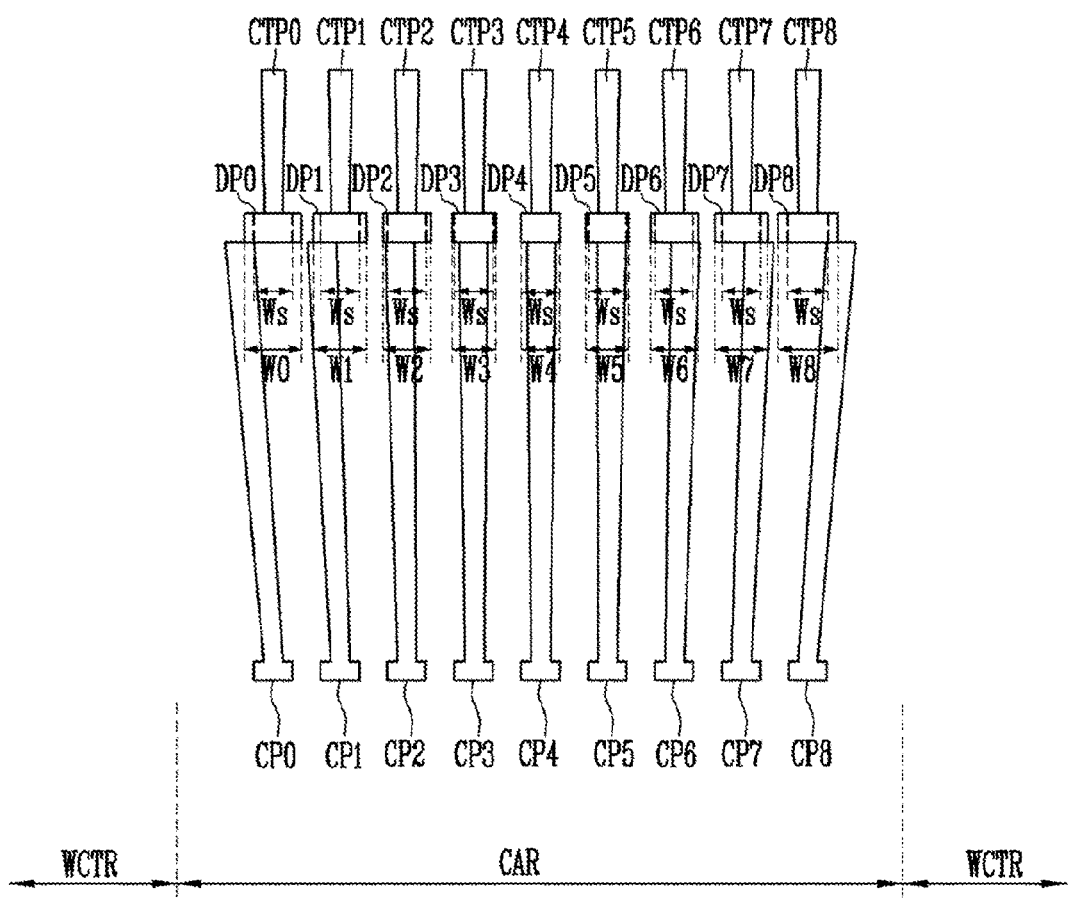
FIGS. 5A and 5B are diagrams comparing widths of pads according to an embodiment of the present disclosure with widths of pads that are designed without reflecting bending tendency of cell plugs.
Figure 5B:
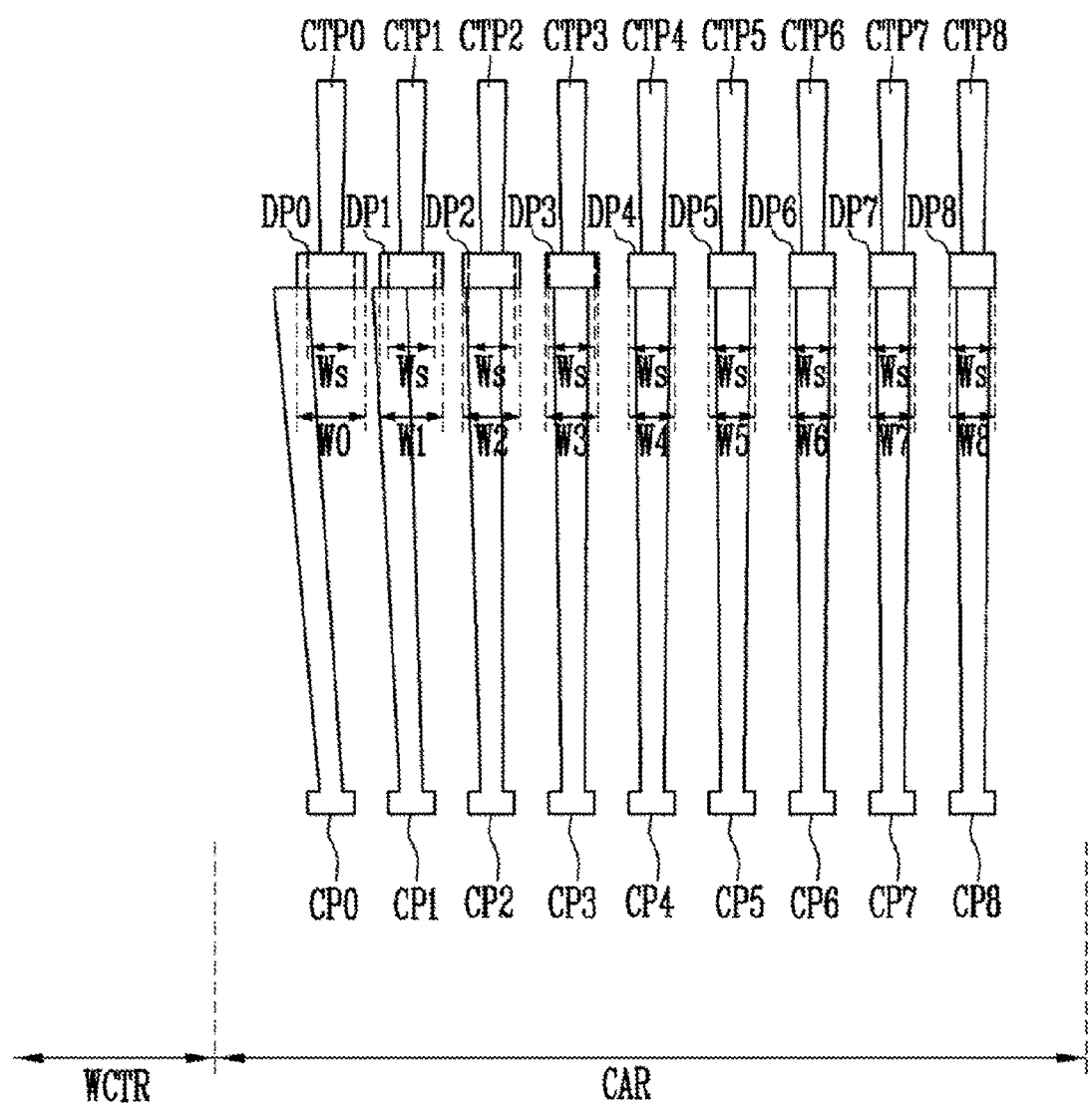

FIGS. 5A and 5B are views comparing the widths W0 to W8 of the pads DP0 to DP8 according to an embodiment of the present disclosure, with the width Ws of pads designed without reflecting the bending tendency of the cell plugs.

As described above, the bending tendency of the cell plugs may be caused in both directions or in one direction. Therefore, the case where the bending tendency is caused in both directions is illustrated in FIG. 5A and the case where the bending tendency is caused in one direction is illustrated in FIG. 5B.

The bidirectional bending phenomenon may mainly occur on the 'U'-shaped string. Therefore, the case of including the 'U'-shaped string may be regarded as pertaining to FIG. 5A. The unidirectional bending phenomenon may mainly occur on the straight shaped string. Therefore, the case of including the straight string may be regarded as pertaining to FIG. 5B. However, the present disclosure is not limited to this.

The pads according to the present disclosure are represented by solid lines, and the pads designed without reflecting the bending tendency of the cell plugs are represented by dotted lines.

First, referring to FIG. 5A illustrating the case of the bidirectional bending tendency, since the above-described tensile/compressive force seldom has an influence on a cell plug CP4 that is disposed at the center of the cell array region CAR, the bending phenomenon is not caused in the cell plug CP4. The cell plug CP4 is not misaligned with a contact plug CTP4 that is disposed over the cell plug CP4, so that the width of a pad DP4 that is disposed therebetween does not have to be increased. That is, the width W4 of the pad DP4 that is disposed at the center of the cell array region CAR is maintained in the same width as the width Ws of the pad (W4=Ws) designed without reflecting the bending tendency of the cell plugs.

The bending phenomenon occurs, due to the above-described tensile/compressive force, on cell plugs CP3 and CP5 that are disposed at positions closer to the word line contact region WCTR than is the cell plug CP4. The cell plugs CP3 and CP5 are slightly misaligned with contact plugs CTP3 and CTP5 that are respectively disposed over the cell plugs CP3 and CP5, and slight leakage current from the bit line may be generated. To overcome this, a width W3 of the pad DP3 that is disposed at a position closer to a left word line contact region WCTR (that is, the word line contact region that makes contact with the first side <1> of the cell array region) than is the pad DP4, is slightly increased compared to that of the pad DP4 (W3>W4). As a result, the cell plug CP3 is stably coupled to the contact plug CTP3. Symmetrically, a width W5 of the pad DP5 that is disposed at a position closer to a right word line contact region WCTR (that is, the word line contact region that comes into contact with the third side <3> of the cell array region) than is the pad DP4, is slightly increased compared to that of the pad DP4 (W5>W4). Consequently, the cell plug CP5 is stably coupled to the contact plug CTP5.

The cell plugs CP2 and CP6 that are disposed at positions closer to the word line contact regions WCTR than are the cell plugs CP3 and CP5 are significantly bent compared to the cell plugs CP3 and CP5. Degrees at which the cell plugs CP2 and CP6 are misaligned with the contact plugs CTP2 and CTP6 that are respectively disposed thereover are larger than those of the cell plugs CP3 and CP5. In this case, although the cell plugs have not completely deviated from the contact plug, leakage current from the bit line may be generated. To avoid this, the pad DP2 that is disposed at a position closer to the left word line contact region WCTR than is the pad DP3 has a width W2 greater than that of the pad DP3 (W2>W3) so that the coupling between the cell plug CP2 and the contact plug CTP2 is reliably secured. Symmetrically, the pad DP6 that is disposed at a position closer to the right word line contact region WCTR than is the pad DP5 has a width W6 greater than that of the pad DP5 (W6>W5). As a result, the coupling between the cell plug CP6 and the contact plug CTP6 is reliably secured.

Cell plugs CP1 and CP7 that are disposed at positions closer to the word line contact region WCTR than are the cell plugs CP2 and CP6 are significantly bent compared to the cell plugs CP2 and CP6. The cell plugs CP1 and CP7 are respectively misaligned with the contact plugs CTP1 and CTP7 at degrees in which they almost completely deviate from contact plugs CTP1 and CTP7 that are respectively disposed over the cell plugs CP1 and CP7. In this case, leakage current from the bit line may be generated, and EFR failure may be generated. To overcome this, a width W1 of the pad DP1 that is disposed at a position closer to the left word line contact region WCTR than is the pad DP2 is increased (W1>W2) compared to that of the pad DP2. Consequently, the cell plug CP1 may be stably coupled to the contact plug CTP1. Symmetrically, a width W7 of the pad DP7 that is disposed at a position closer to the right word line contact region WCTR than is the pad DP6 is increased (W7>W6) compared to that of the pad DP6. Consequently, the cell plug CP7 may be stably coupled to the contact plug CTP7.

Cell plugs CP0 and CP8 that are disposed at positions closest to the word line contact region WCTR are most significantly bent. The cell plugs CP0 and CP8 completely deviate from contact plugs CTP0 and CTP8 that are respectively disposed over the cell plugs CP0 and CP8. In this case, the pad formed without differential-width structure may no longer couple the cell plugs to the corresponding contact plugs. Leakage current from the bit line is generated, and EFR failure deteriorates. To overcome this, a width W0 of the pad DP0 that is disposed at a position closer to the left word line contact region WCTR than is the pad DP1 is increased (W0>W1) compared to that of the pad DP1. Consequently, the cell plug CP0 may be stably coupled to the contact plug CTP0. Misalignment between the cell plug CP0 and the contact plug CTP0 is mitigated. Symmetrically, a width W8 of the pad DP8 that is disposed at a position closer to the right word line contact region WCTR than is the pad DP7 is increased (W8>W7) compared to that of the pad DP7. As a result, the coupling between the cell plug CP8 and the contact plug CTP8 is stabilized.

As such, the pads DP0 to DP8 have a differential-width structure in which the widths W0 to W8 thereof are gradually increased toward the word line contact region WCTR including the stepwise structure. Thereby, the misalignment between the cell plug and the contact plug is effectively mitigated. It is sufficient if the widths W0 to W8 have the differential-width structure toward only the word line contact region WCTR (that is, in only the x-direction) in the cell array region CAR, taking the bending tendency of the cell plugs into account.

The case of the semiconductor memory device having the unidirectional bending tendency will be described with reference to FIG. 5B. The word line contact region WCTR is disposed at only one side of the cell array region CAR, that is, the first side <1>. Therefore, the above-described bending tendency of the cell plugs CP0 to CP8 is induced on only one side of the cell array region CAR. The degree at which a cell plug CP0 disposed at a position closest to the word line contact region WCTR is bent is greatest, and the degree at which the cell plugs are bent is reduced from the left side toward the right side. A pad DP0 has a greatest width W0 to make it possible to couple the cell plug CP0 to the contact plug CTP0 disposed thereover. The increment in width of the pads decreases (W0>W1>W2>W3>W4) as the distance from the word line contact region WCTR increases, and the width is not varied from the pad DP4 disposed at the center of the cell array region. That is, the pads DP4 to DP8 may be maintained in the same width as the width Ws of the pad designed without reflecting the bending tendency of the cell plugs (W4=Ws, W5=Ws, W6=Ws, W7=Ws, W8=Ws). As such, the pads according to an embodiment of the present disclosure have a differential-width structure in which the width is increased toward the word line contact region, taking the bending tendency of the cell plugs into account. Consequently, the misalignment between the cell plug and the contact plug is effectively mitigated.

Hereinafter, the method of manufacturing the semiconductor memory device according to an embodiment of the present disclosure will be described. Hereinbelow, although, for the sake of explanation, the description of the manufacturing method will be focused on a memory device including a pipe gate, the present disclosure is not limited to this. The manufacturing method capable of forming a pad having a differential-width structure according to an embodiment of the present disclosure may be applied to memory devices having various structures, such as a memory device formed without a pipe gate, in which a plug bending phenomenon may be caused.

FIGS. 6A to 12B are sectional views illustrating a method of manufacturing a semiconductor memory device according to an embodiment of the present disclosure.

Each of drawings (FIGS. 6A, 7A, 8A, 9A, 10A, 11A and 12A) indicated with 'A' among FIGS. 6A to 12B is a sectional view taken along direction A-A' illustrated in FIG. 1. Each of drawings (FIGS. 6B, 7B, 8B, 9B, 10B, 11B and 12B) indicated with 'B' is a sectional view taken along direction B-B' illustrated in FIG. 1 (or direction B-B' illustrated in FIG. 2). The direction B-B' is also illustrated in each of the drawings indicated with 'A'.

Figure 6A:
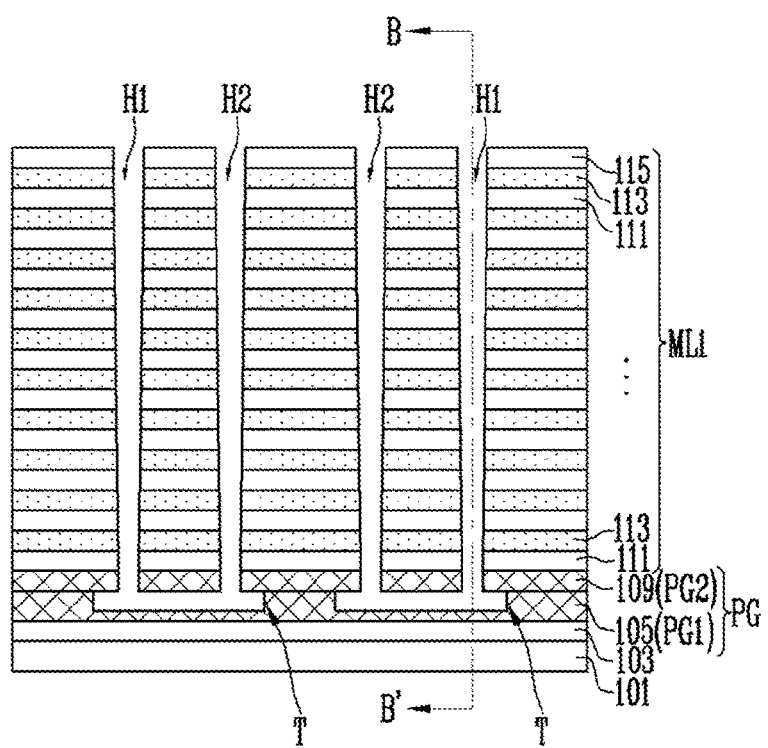
Figure 6B:
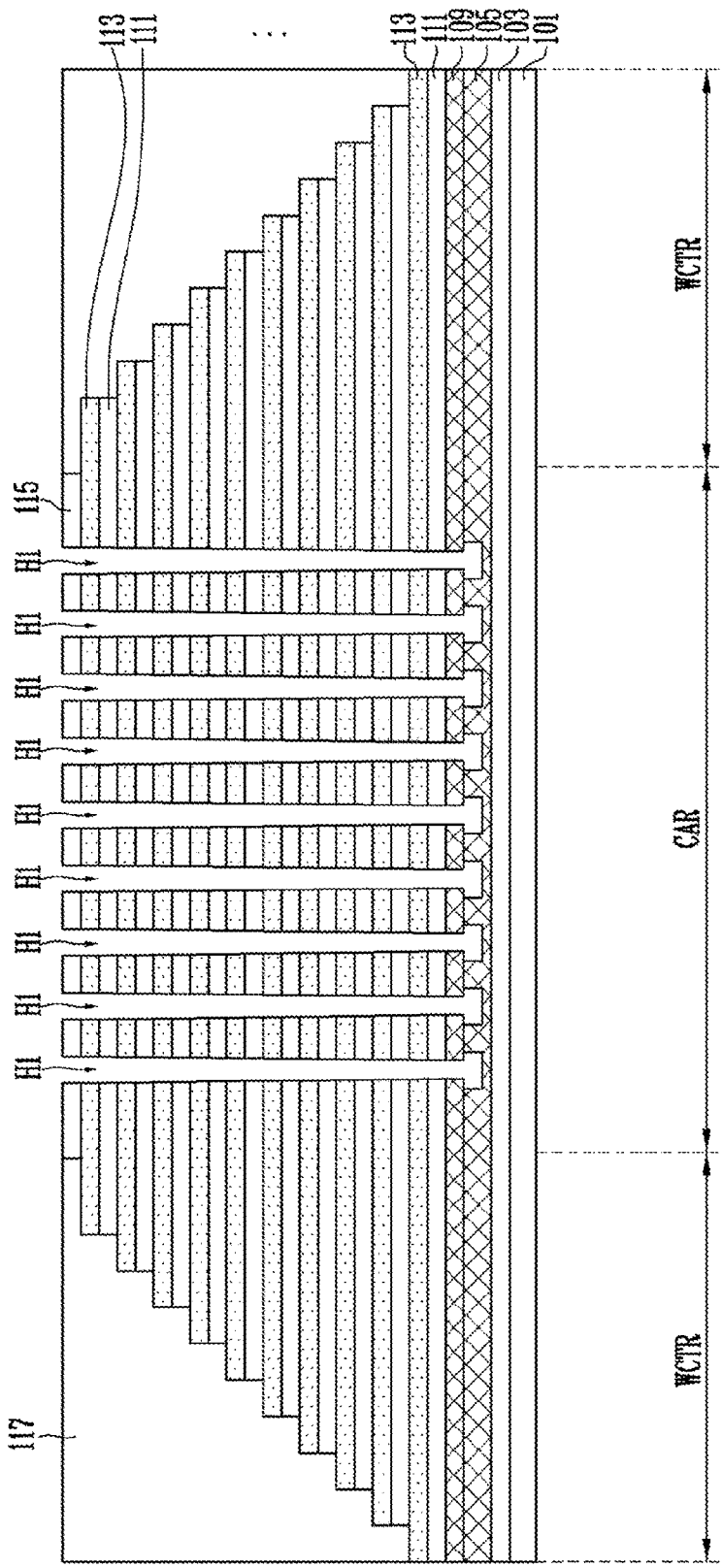

First, referring to FIGS. 6A and 6B, a first interlayer insulating layer 103 may be formed on a substrate 101.

Thereafter, a pipe gate PG in which a sacrificial layer is embedded may be formed on the first interlayer insulating layer 103. The pipe gate PG may include a first conductive layer 105 that is used as a first pipe gate PG1, and a second conductive layer 109 that is used as a second pipe gate PG2. The first conductive layer 105 may be formed on the first interlayer insulating layer 103. After the first conductive layer 105 has been formed, a plurality of trenches T may be formed in the first conductive layer 105 by etching portions of the first conductive layer 105. Thereafter, the trenches T may be filled with a sacrificial layer. Subsequently, the second conductive layer 109 may be formed on the entirety of the structure in which the sacrificial layer is formed. However, the present disclosure is not limited to this, and the pipe gate may be formed by various methods.

A plurality of second interlayer insulating layers 111 and a plurality of sacrificial layers 113 are alternately stacked on the pipe gate PG, thus forming a first stacked structure ML1.

The plurality of sacrificial layers 113 may be provided to form word lines that are cell gates, and some of the sacrificial layers 113 may be provided to form dummy word lines. The plurality of sacrificial layers may be provided to form drain select lines or source select lines. A third interlayer insulating layer 115 may be disposed in an uppermost layer of the first stacked structure ML1. The number of stacked sacrificial layers 113 may be variously designed depending on the number of stacked memory cells to be formed.

Referring to FIG. 6B, a stepwise structure may be formed in the word line contact region WCTR by etching the third interlayer insulating layer 115, and the second interlayer insulating layer 111 and the sacrificial layers 113 that are alternately stacked.

Thereafter, a fourth interlayer insulating layer 117 which covers the stepwise structure may be formed.

Subsequently, vertical holes H1 and H2 which expose opposite ends of the sacrificial layer disposed in each trench T may be formed by removing portions of the first stacked structure ML1 and the second conductive layer 109 through an etching process. For the sake of explanation, one among the vertical holes for each trench refers to a first vertical hole H1 and the other one refers to a second vertical hole H2. For example, the first and second vertical holes H1 and H2 may be formed such that the second vertical holes H2 are formed between the first vertical holes H1.

Subsequently, the trench T is opened by selectively removing the sacrificial layer.

Figure 7A:
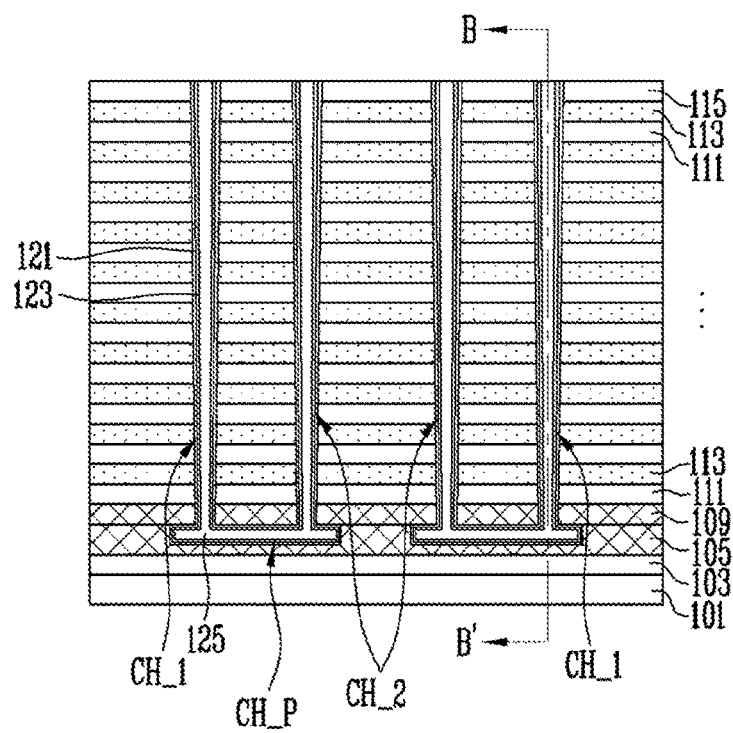

Referring to FIGS. 7A and 7B, a multilayer layer 121 may be formed along inner surfaces of the trench T and the first and second vertical holes H1 and H2. The multilayer layer 121 may have a structure in which a charge blocking layer, a charge trapping layer, and a tunnel insulating layer are stacked.

Thereafter, a channel layer 123 may be formed along the surface of the multilayer layer 121. In the channel layer 123, a channel layer which is formed along the inner sidewall of the first vertical hole H1 refers to a first vertical channel layer CH_1, a channel layer which is formed along the inner sidewall of the second vertical hole H2 refers to a second vertical channel layer CH_2, and a channel layer which is formed along inner surface of the trench T refers to a pipe channel layer CH_P.

In addition, the trench T and the first and second vertical holes H1 and H2 to which the channel layer 123 is applied may be filled with a gap fill insulating layer 125.

Figure 8A:
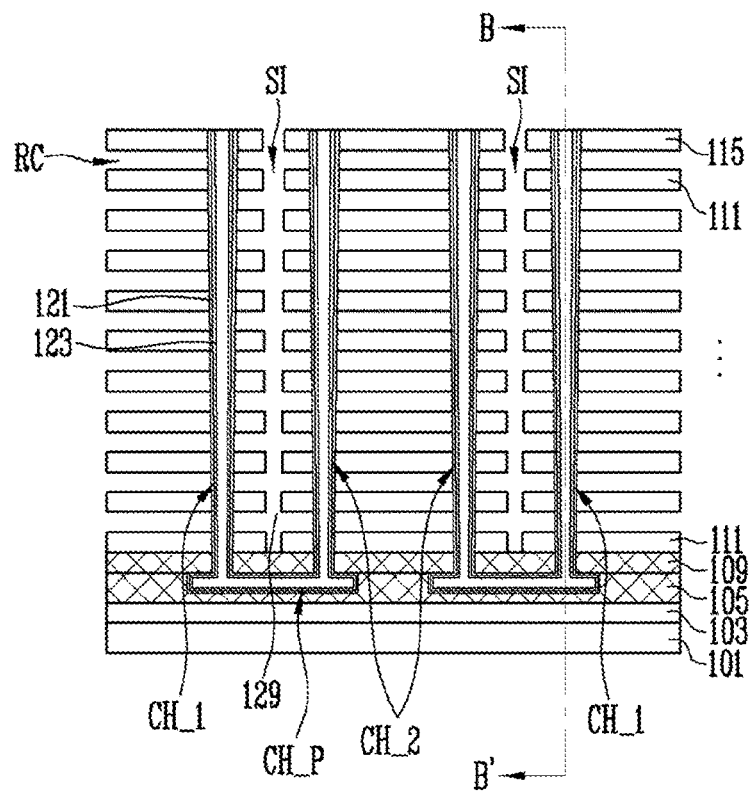
Figure 8B:
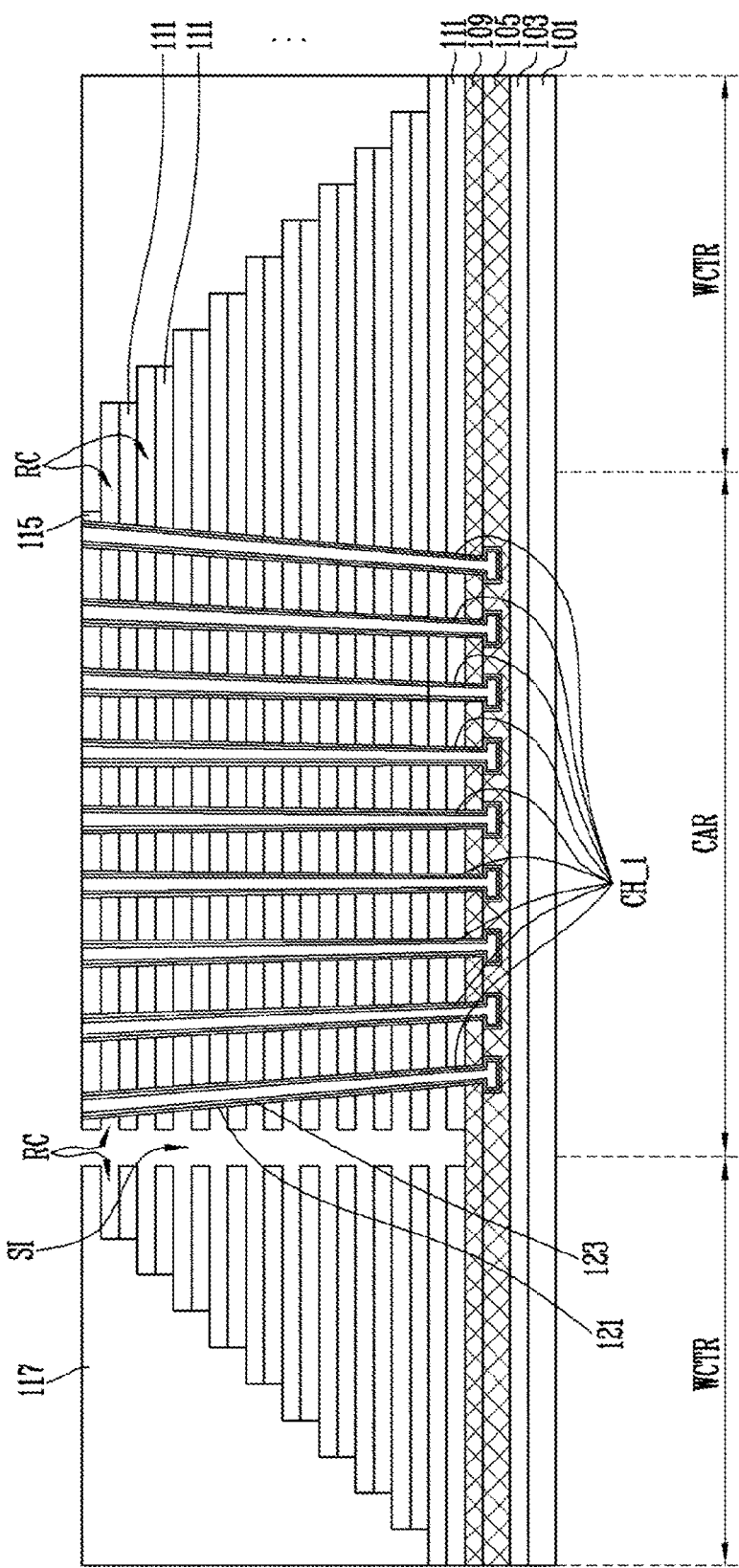

Referring to FIGS. 8A and 8B, portion of the first stacked structure ML1 disposed between the first and second vertical holes H1 and H2 may be etched, whereby a slit SI may be formed to vertically penetrate the first stacked structure ML1.

The slit SI may be formed to expose the second conductive layer 109, and have various shapes in the x-axis direction and in the y-axis direction. Consequently, the sacrificial layers 113 of the first stacked structure ML1 may be divided into word lines and drain select lines that enclose the first vertical hole H1, and word lines and source select lines that enclose the second vertical hole H2.

Subsequently, the sacrificial layers 113 that are exposed in the slit are removed. A wet etching process may be used to remove the sacrificial layers 113. When the sacrificial layers 113 are removed, a recess RC may be formed between the second interlayer insulating layers 111.

The recess RC is formed between the second interlayer insulating layers 111 over the cell array region CAR and the word line contact region WCTR. Therefore, as described with reference to FIGS. 3 and 4, the tensile/compressive force may be applied between the fourth interlayer insulating layer 117 that covers the stepwise stacked structure and the second interlayer insulating layers 111 that form the stepwise stacked structure.

The tensile/compressive force may increase as the number of stacked second interlayer insulating layers 111 that form the stacked structure increases. As a result, as illustrated in FIGS. 8A and 8B, the channel layers CH_1 may be bent outward. The degree at which the channel layers are bent may be increased toward the word line contact region WCTR.

Taking the bending tendency of such channel layer CH_1 into account, the following pads DP0 to DP8 to be formed on the channel layer CH_1 have a differential-width structure.

Figure 9A:
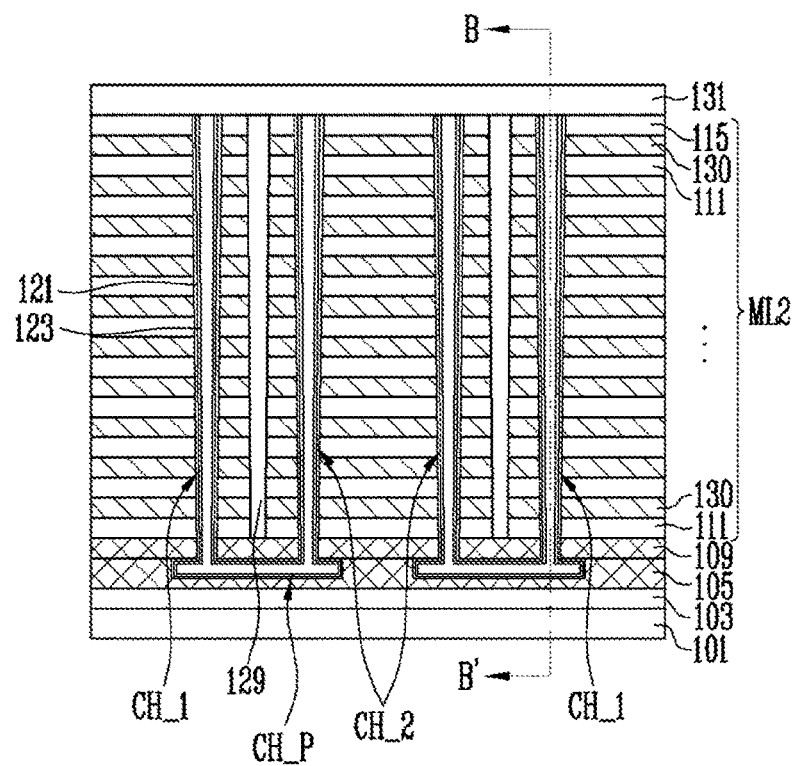

Referring to FIGS. 9A and 9B, the recess RC may be filled with third conductive layers 130. Consequently, a second stacked structure ML2 in which the second interlayer insulating layers 111 and the third conductive layers 130 are alternately stacked is formed. The third conductive layers 130 are also formed in the word line contact region WCTR such that a stepwise stacked structure is formed.

Subsequently, portions of the third conductive layers 130 that are disposed in the slit SI may be removed, and the slit SI may be filled with a gap fill insulating layer 129.

Thereafter, a fifth interlayer insulating layer 131 may be formed over the entirety of the structure including the stepwise stacked structure. The thicknesses of pads and a common source line to be subsequently formed may be determined depending on the height of the fifth interlayer insulating layer 131. Therefore, taking into account this, the fifth interlayer insulating layer 131 may be formed.

Figure 10A:
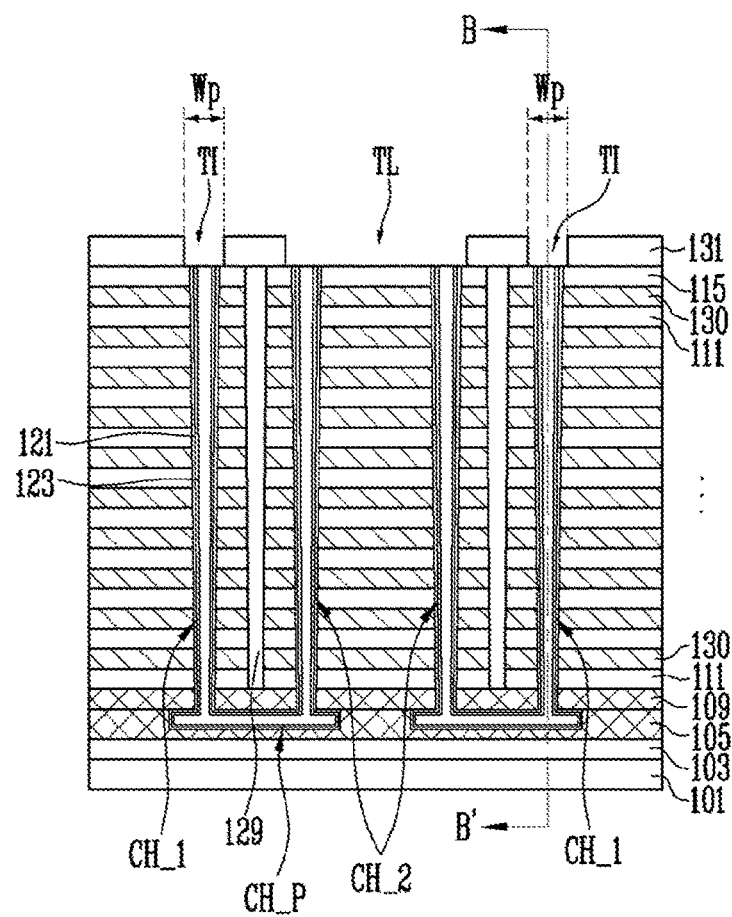
Figure 10B:
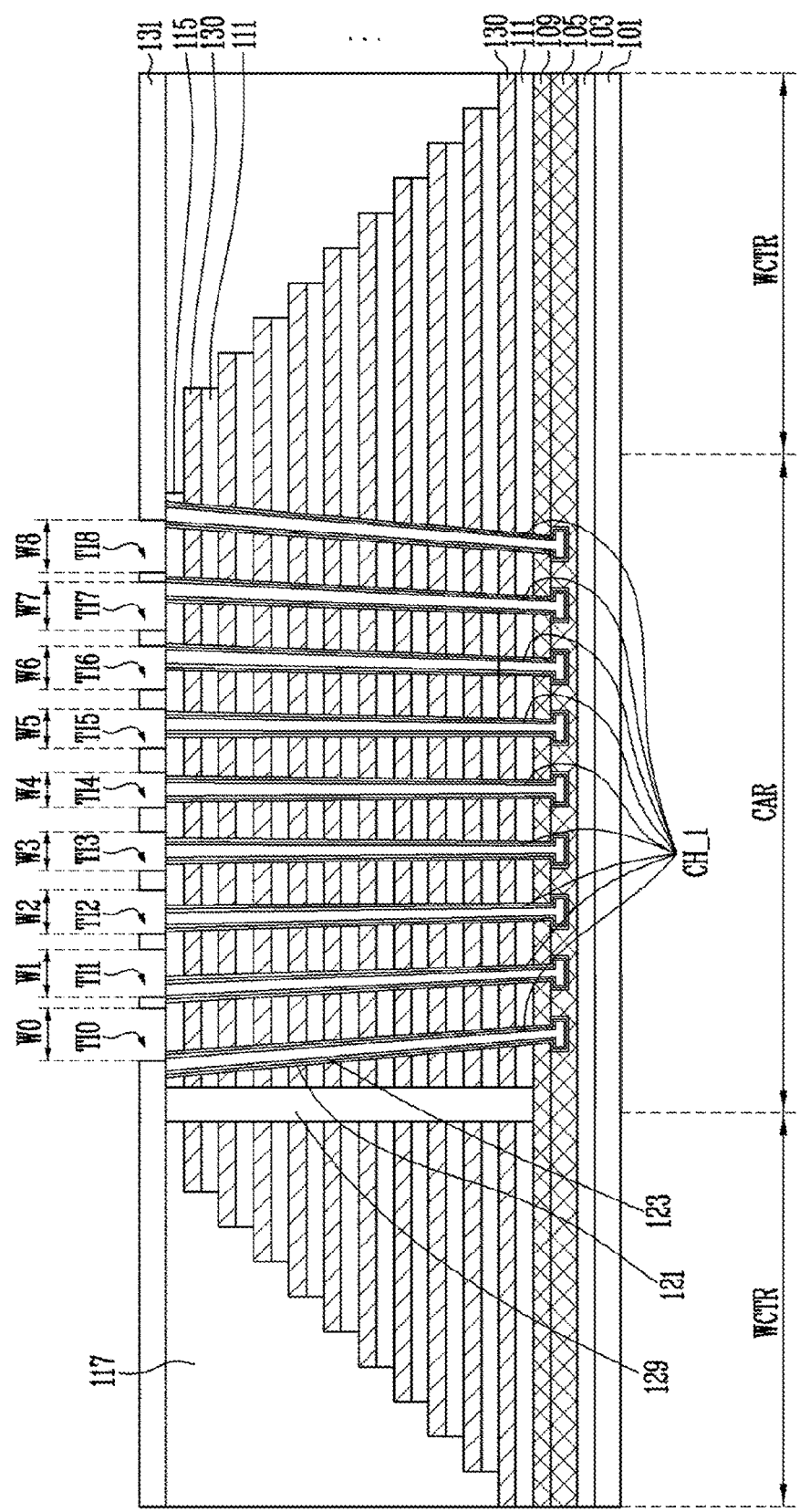

Referring to FIGS. 10A and 10B, drain trenches TI that expose the first vertical channel layers CH_1 and portions of the third interlayer insulating layer 115, and a source trench TL that exposes the second vertical channel layers CH_2 and portions of the third interlayer insulating layer 115 are formed by removing portions of the fifth interlayer insulating layer 131.

The drain trench TI has the form of an island, exposing a region including the first vertical channel layer CH_1. The source trench TL has the form of a line, exposing a region including the second vertical channel layer CH_2.

For example, the drain trenches TI are arranged parallel to each other in the x-axis direction of FIG. 1. The drain trenches TI arranged parallel to each other in the x-axis direction are successively designated as TI0 to TI8 illustrated in FIG. 10B. The source trench TL is formed to extend in the x-axis direction of FIG. 1.

To prevent misalignment between the first vertical channel layer CH_1 and a contact plug to be subsequently formed, the width Wp of the drain trench TI in the y-axis direction may be greater than that of the first vertical channel layer CH_1. The width of the drain trench TI in the x-axis direction may be formed such that the differential-width structure is provided. That is, the drain trenches TI0 to TI8 that are arranged parallel to each other in the x-axis direction are formed such that the the widths W0 to W8 thereof are increased toward the word line contact region WCTR.

Referring to FIGS. 11A and 11B, the drain trenches TI and the source trench TL are filled with conductive material 133 so as to form pads DP and a common source line SL. For example, the conductive material 133 with which each drain trench TI is filled becomes the pad DP, and the conductive material 133 with which the source trench TL is filled becomes the common source line SL. The pads DP are arranged parallel to each other in the x-axis direction of FIG. 1. The pads DP arranged parallel to each other in the x-axis direction are successively designated as DP0 to DP8 illustrated in FIG. 11b. The common source line SL is formed to extend in the x-axis direction of FIG. 1.

Although not illustrated in the drawings, in the case where a plurality of contact holes (not illustrated) are formed in the word line contact region WCTR to expose portions the third conductive layers 130 having the stepwise stacked structure and portions of the second conductive layer 109, the conductive material 133 with which the contact holes (not illustrated) are filled may become a word line contact plug (not illustrated).

The pads DP and the common source line SL are formed by filling the drain trenches TI and the source trench TL with the conductive material 133, in other words, are formed by a damascene method. Although the pads DP and the common source line SL are formed by a single damascene method in a present embodiment, the pads DP and the common source line SL may be formed by a dual damascene method. The conductive material 133 may be formed of a polysilicon layer, a metal layer or a stack layer including a polysilicon layer and a metal layer.

Figure 12A:
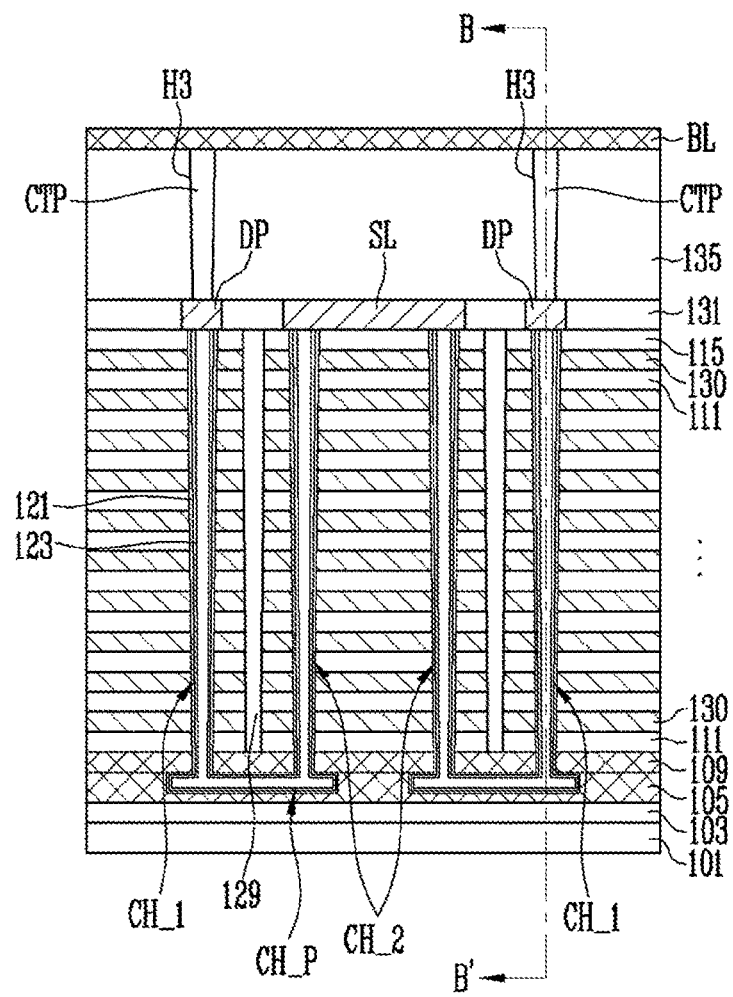
Figure 12B:
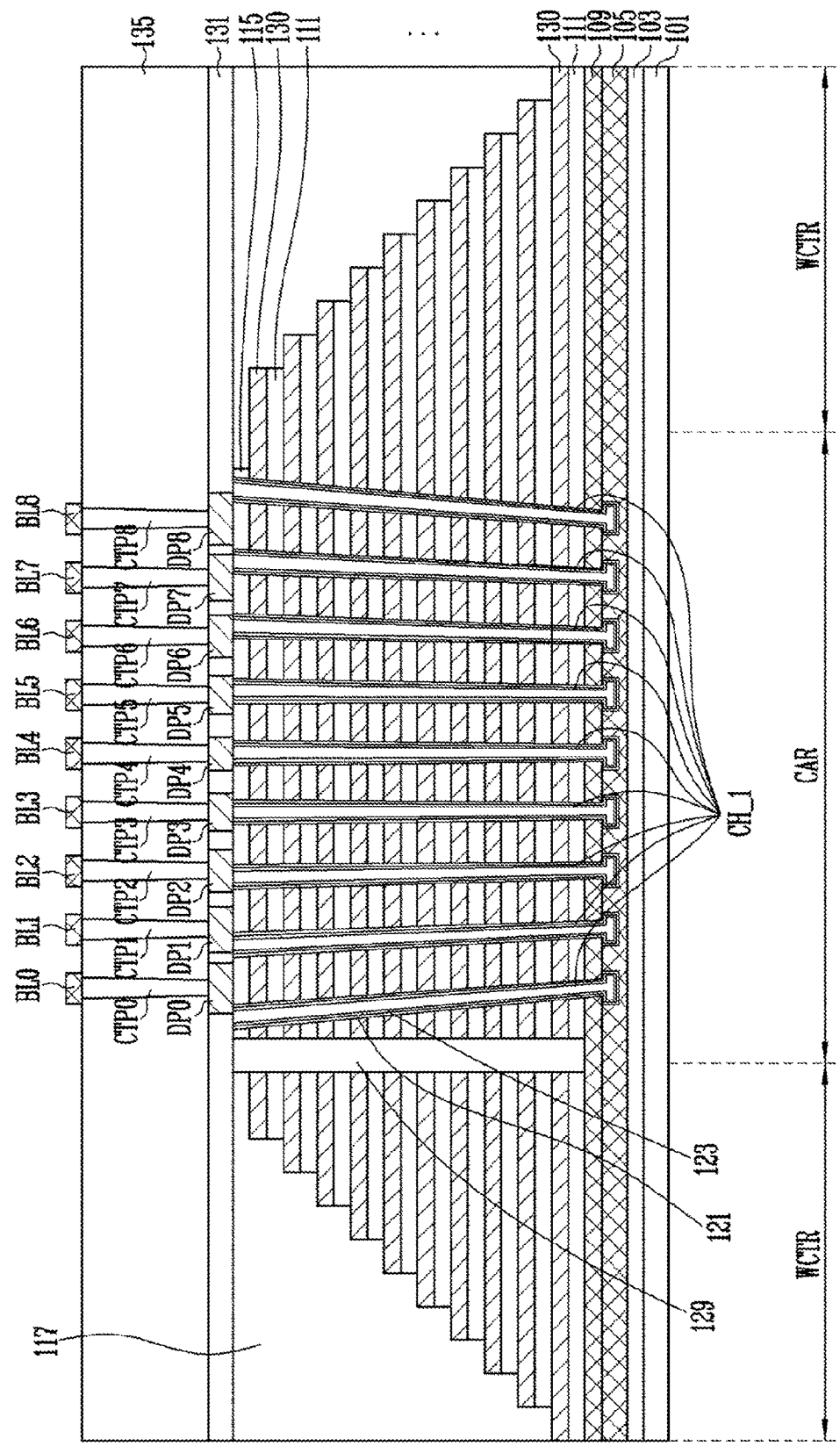

Referring to FIGS. 12A and 12B, a sixth interlayer insulating layer 135 is formed on the entirety of the structure in which the pads DP and the common source line SL are formed. The sixth interlayer insulating layer 135 may be formed of a silicon oxide layer.

Subsequently, third vertical holes H3 that exposes the respective pads DP are formed by etching portions of the sixth interlayer insulating layer 135. To prevent misalignment between the pads and contact plugs to be subsequently formed, the width of each third vertical hole H3 may be less than that of the corresponding pad DP.

Thereafter, the third vertical holes H3 are filled with conductive material, whereby the contact plugs CTP are formed. The contact plugs CTP is arranged parallel to each other in the x-axis direction of FIG. 1. The contact plugs CTP arranged parallel to each other in the x-axis direction are successively designated as CTP0 to CTP8 illustrated in FIG. 12B. The conductive material may be formed of a polysilicon layer or a metal layer. Subsequently, bit lines BL are formed by forming a conductive layer over the entire structure in which the contact plugs CTP are formed. The bit lines BL are formed to extend in the y-axis direction of FIG. 1. In addition, the bit line BL is formed parallel to each other in the x-axis direction of FIG. 1. The bit line BL formed parallel to each other in the x-axis direction are successively designated as BL0 to BL8 illustrated in FIG. 12B.

Although the description of the manufacturing process has been focused on the case where the semiconductor memory device includes a 'U'-shaped string, the semiconductor memory device including a straight string may also be formed using some of the processes described with reference to FIGS. 6A to 12B.

Figure 13:
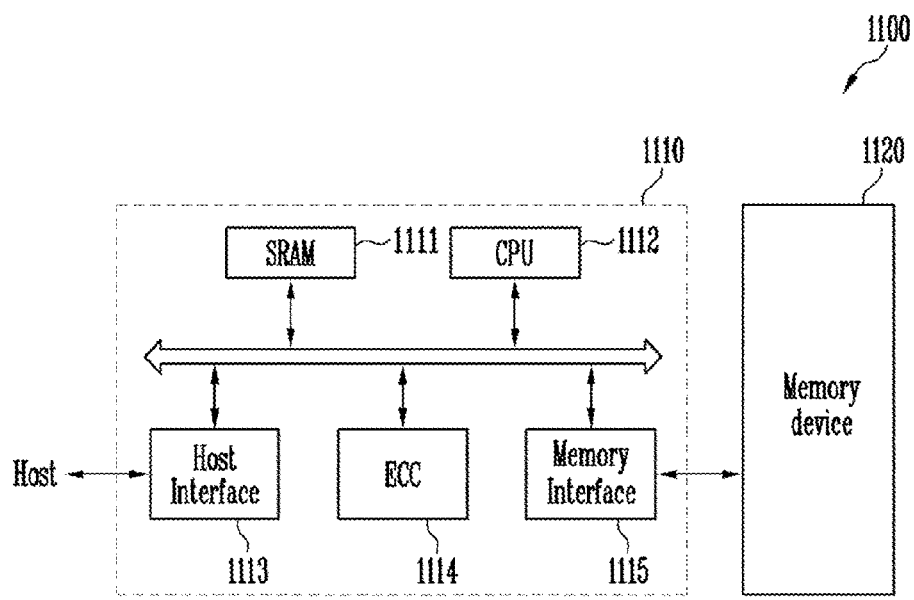
FIG. 13 is a block diagram illustrating a memory system according to an embodiment of the present disclosure.

FIG. 13 is a block diagram illustrating a memory system according to an embodiment of the present disclosure.

Referring FIG. 13, the memory system 1100 according to the embodiments of the present disclosure includes a memory device 1120 and a memory controller 1110.

The memory device 1120 may include the structures described with reference to FIGS. 1 to 5B. For example, the memory device 1120 may include a pad having a differential-width structure in which the width of the pad is increased toward the word line contact region including a stepwise stacked structure. In addition, the memory device 1120 may be a multi-chip package including a plurality of flash memory chips.

The memory controller 1110 is configured to control the memory device 1120, and may include an SRAM (Static Random Access Memory) 1111, a CPU 1112, a host interface 1113, an ECC (Error Correction Code) 1114, and a memory interface 1115. The SRAM 1111 is used as an operation memory of the CPU 1112. The CPU 1112 performs general control operations for data exchange of the memory controller 1110. The host interface 1113 is provided with a data interchange protocol of a host coupled with the memory system 1100. Furthermore, the ECC 1114 detects and corrects an error included in the data that is read from the memory device 1120, and the memory interface 1115 interfaces with the memory device 1120. In addition, the memory controller 1110 may further include a ROM (Read Only Memory) or the like that stores code data for interfacing with the host.

The above-described memory system 1100 may be a memory card or an SSD (Solid State Disk) equipped with the memory device 1120 and the controller 1110. For example, when the memory system 1100 is an SSD, the memory controller 1110 may communicate with the outside (e.g., host) via one of various interface protocols, such as an USB (Universal Serial Bus), an MMC (MultiMedia Card), a PCI-E (Peripheral Component Interconnection-Express), an SATA (Serial Advanced Technology Attachment), a PATA (Parallel Advanced Technology Attachment), an SCSI (Small Computer Small Interface), an ESDI (Enhanced Small Disk Interface), or an IDE (Integrated Drive Electronics).

Figure 14:
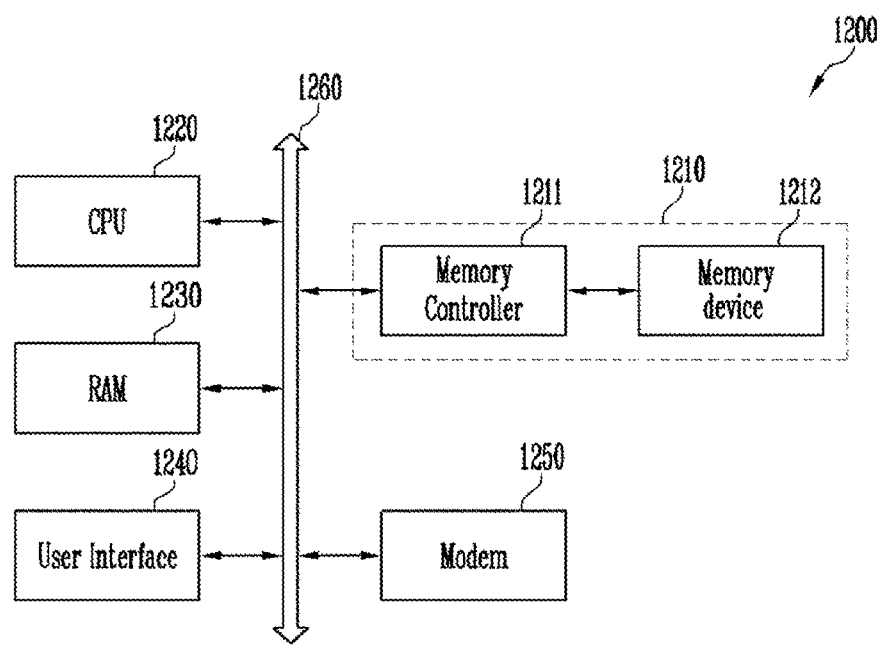
FIG. 14 is a block diagram illustrating a computing system according to an embodiment of the present disclosure.

FIG. 14 is a block diagram illustrating a computing system in accordance with an embodiment of the present disclosure.

Referring to FIG. 14, the computing system 1200 in accordance with the embodiments of the present disclosure may include a CPU 1220, a RAM (Random Access Memory) 1230, a user interface 1240, a modem 1250, and a memory system 1210 that are electrically coupled to a system bus 1260. Furthermore, if the computing system 1200 is a mobile device, it may further include a battery for supplying operating voltage to the computing system 1200. An application chip set, a camera image processor CIS, a mobile DRAM and the like may be further included.

As described above with reference to FIG. 13, the memory system 1210 may be configured with the memory device 1212 and the memory controller 1211.

According to the present disclosure, misalignment between a cell plug and a contact plug, which may be caused by a cell plug bending phenomenon, may be reduced, whereby the operation reliability of a semiconductor memory device may be improved.

Furthermore, according to the present disclosure, leakage current from a bit line may be mitigated, and EFR (Early Fail Rate) failure may be mitigated.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
   channel layers protruding away from a substrate;
   conductive layers configured to enclose the channel layers and stacked on the substrate, the conductive layers extending in a first direction;
   a plurality of pads coupled to the channel layers and arranged in the first direction; and
   a plurality of bit lines coupled to the channel layers through the plurality of pads,
   wherein a pad of the plurality of pads has a width in the first direction so that the pad is wider relative to a preceding pad of the plurality of pads, and
   wherein the channel layers are directly connected to the pads, respectively.

2. The semiconductor memory device according to claim 1, wherein the conductive layers extend in the first direction and form a stepwise structure.

3. The semiconductor memory device according to claim 2, wherein the pads increases in width toward the stepwise structure.

4. The semiconductor memory device according to claim 1, wherein the width of each of the pads with respect to the first direction is greater than a width of the preceding pad in the first direction.

5. The semiconductor memory device according to claim 1, wherein widths of the pads with respect to a second direction intersecting the first direction are the same as each other.

6. The semiconductor memory device according to claim 1, wherein upper ends of the channel layers are coupled with lower portions of the respective pads.

7. The semiconductor memory device according to claim 6, wherein the width of each of the pads with respect to the first direction or a width of each of the pads with respect to a second direction intersecting the first direction are greater than widths of the upper ends of the channel layers.

8. The semiconductor memory device according to claim 1, further comprising:
   contact plugs coupled to the pads and arranged in the first direction.

9. The semiconductor memory device according to claim 8, wherein lower ends of the contact plugs are coupled with upper portions of the respective pads.

10. The semiconductor memory device according to claim 9, wherein the width of each of the pads with respect to the first direction or a width of each of the pads with respect to a second direction intersecting the first direction are greater than widths of the lower ends of the contact plugs.

11. The semiconductor memory device according to claim 1, further comprising:
    a source line disposed in the same layer as the pads.

12. The semiconductor memory device according to claim 2, further comprising:
    interlayer insulating layers configured to enclose the channel layers and alternately stacked with the conductive layers on the substrate, the interlayer insulating layers extending in the first direction and forming the stepwise structure; and
    an insulating layer configured to cover the stepwise structure.

13. The semiconductor memory device according to claim 1, further comprising:
    multilayer layers disposed between the channel layers and the conductive layers, and configured to enclose the channel layers.

14. The semiconductor memory device according to claim 2,
    wherein the channel layers are formed in a cell array region,
    wherein the stepwise structure is formed in a word line contact region making contact with one side of the cell array region, and
    wherein the pads increase in width toward the word line contact region.

15. The semiconductor memory device according to claim 8, wherein the bit lines are coupled to the contact plugs and arranged in the first direction.

16. The semiconductor memory device according to claim 15, wherein upper ends of the contact plugs are coupled with lower portion of the bit lines.

17. The semiconductor memory device according to claim 15, wherein the bit lines extend in a second direction intersecting the first direction.

18. A semiconductor memory device comprising:
a plurality of bit lines;
a source line;
channel layers coupled between the plurality of bit lines and the source line; and
pads arranged on the channel layers, wherein the channel layers are directly connected to the pads, respectively,
wherein the plurality of bit lines are coupled to the channel layers through the pads, and
wherein the pads include a first pad disposed at a medial portion, a second pad disposed at a first outermost position and a third pad disposed at a second outermost position, and a width of the second pad or the third pad is greater than a width of the first pad.

19. The semiconductor memory device according to claim 18, wherein distances between a word line contact region and the pads are reduced from the pad that is disposed at the medial portion toward at least one of the pad that is disposed at the first outermost position and the pad that is disposed at the second outermost position.

20. The semiconductor memory device according to claim 19,
wherein the channel layers are formed in a cell array region, and
wherein the word line contact region makes contact with at least one side of the cell array region.

21. The semiconductor memory device according to claim 18, wherein the width of the second pad is substantially symmetrical with the width of the third pad with reference to the first pad.

22. The semiconductor memory device according to claim 18, wherein a width of each of the pads between the first outermost position and the first pad is substantially symmetrical with a width of each of the pads between the second outermost position and the first pad.

23. A semiconductor memory device comprising:
contact plugs;
channel layers protruding away from a substrate; and
a plurality of pads respectively coupled between the contact plugs and channel layers,
wherein the pads have a greater width as a bending of the channel layers or the contact plugs increases.

24. The semiconductor memory device according to claim 23, wherein at least one pad from the plurality of pads has a greater width than another pad from the plurality of pads.

25. The semiconductor memory device according to claim 24, wherein the at least one pad from the plurality of pads has substantially the same width as the another pad from the plurality of pads.

26. The semiconductor memory device according to claim 23, further comprising:
conductive layers configured to enclose the channel layers and stacked on the substrate, the conductive layers extending in a first direction,
wherein the pads are arranged in the first direction, and
wherein the pads increase in width in the first direction so that each of the pads is wider relative to a preceding pad.

* * * * *